(12) United States Patent
Tsuji

(10) Patent No.: US 7,477,523 B2
(45) Date of Patent: Jan. 13, 2009

(54) SEMICONDUCTOR DEVICE AND METHOD OF MANUFACTURING SEMICONDUCTOR DEVICE

(75) Inventor: Daisuke Tsuji, Chuo-ku (JP)

(73) Assignee: Elpida Memory, Inc., Tokyo (JP)

( * ) Notice: Subject to any disclaimer, the term of this patent is extended or adjusted under 35 U.S.C. 154(b) by 139 days.

(21) Appl. No.: 11/678,492

(22) Filed: Feb. 23, 2007

(65) Prior Publication Data
US 2007/0201193 A1 Aug. 30, 2007

(30) Foreign Application Priority Data
Feb. 24, 2006 (JP) .............................. 2006-047954

(51) Int. Cl.
*H05K 7/00* (2006.01)
(52) U.S. Cl. ...................... 361/760; 361/777; 361/761; 361/783; 174/262
(58) Field of Classification Search ................ 361/679, 361/760, 748–741, 761–763, 767, 768, 772, 361/777–779, 783; 174/260–266, 250, 255, 174/257; 257/E21.503, E23.067, E23.069; 29/830, 837, 842, 846
See application file for complete search history.

(56) References Cited

U.S. PATENT DOCUMENTS

| | | | | |
|---|---|---|---|---|
| 5,212,625 | A * | 5/1993 | van Andel et al. ............ | 361/690 |
| 6,326,680 | B1 * | 12/2001 | Steijer et al. ................ | 257/676 |
| 6,338,983 | B1 * | 1/2002 | Steijer et al. ................ | 438/123 |
| 6,846,990 | B2 * | 1/2005 | Kisu et al. ............... | 174/138 E |
| 2001/0054510 | A1 * | 12/2001 | Yoshida et al. .............. | 174/250 |
| 2002/0011349 | A1 * | 1/2002 | Kragl et al. ................. | 174/255 |
| 2003/0178723 | A1 * | 9/2003 | Ito et al. ...................... | 257/735 |
| 2004/0245012 | A1 * | 12/2004 | Wabiszczewicz ........... | 174/250 |
| 2005/0178581 | A1 * | 8/2005 | Lee et al. .................... | 174/250 |
| 2006/0240660 | A1 * | 10/2006 | Yang .......................... | 438/622 |
| 2007/0056765 | A1 * | 3/2007 | Yaung et al. ................ | 174/255 |

FOREIGN PATENT DOCUMENTS

| | | |
|---|---|---|
| JP | 2000-077471 A | 3/2000 |
| JP | 3420076 B2 | 4/2003 |
| JP | 2005-327947 A | 11/2005 |

* cited by examiner

*Primary Examiner*—Jeremy C Norris
*Assistant Examiner*—Hoa C Nguyen
(74) *Attorney, Agent, or Firm*—Sughrue Mion, PLLC

(57) ABSTRACT

A semiconductor device has at least a square wiring board having a board core made of an insulating material, wires made of a metal and formed on a first surface of the board core, a solder resist film formed on the first surface to cover the wires, and openings formed by partially opening the solder resist film, wherein a plurality of the elongated wires are arranged in parallel on the bottom of the openings, a semiconductor chip having electrodes flip chip connected to the wires are arranged on the bottom of the openings of the wiring board through a conductive bonding material, and an insulating resin is provided for filling an interstice between the wiring board and the semiconductor chip, wherein the wires extend along a width direction orthogonal to a longitudinal direction of the openings, the openings comprise elongated grooves which extend along at least two opposing sides of the square of the wiring board, a pair of opposing edges of the opening along the longitudinal direction define zig-zag edges in which the widths of the opening seem to be longer and shorter in a repeating sequence, and recessed edge portions which recess toward the outside of the opening formed by the zig-zag edges in the width direction correspond to the wires, and protruded edge portions which protrude toward the inside of the opening formed by the zig-zag edges in the width direction correspond to the board core between adjoining the wires.

5 Claims, 22 Drawing Sheets

Fig. 3
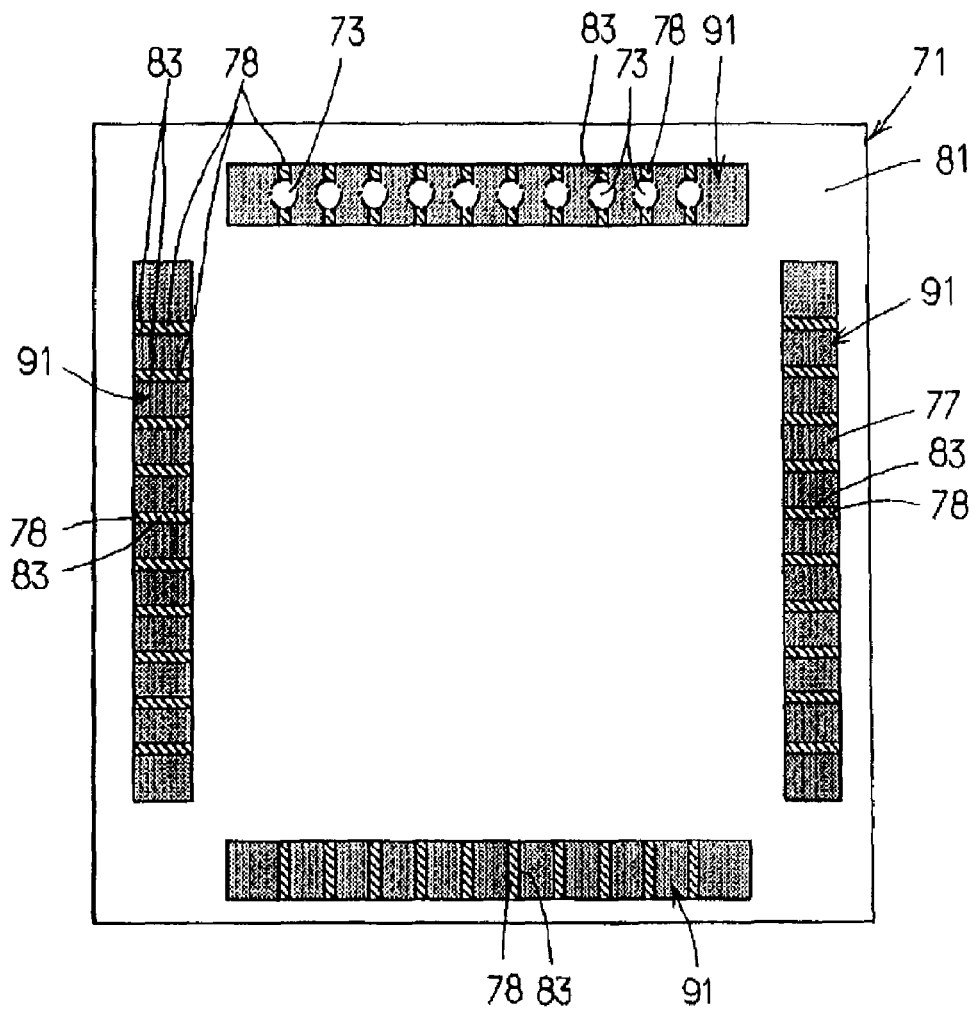
Fig. 4A
Fig. 4B
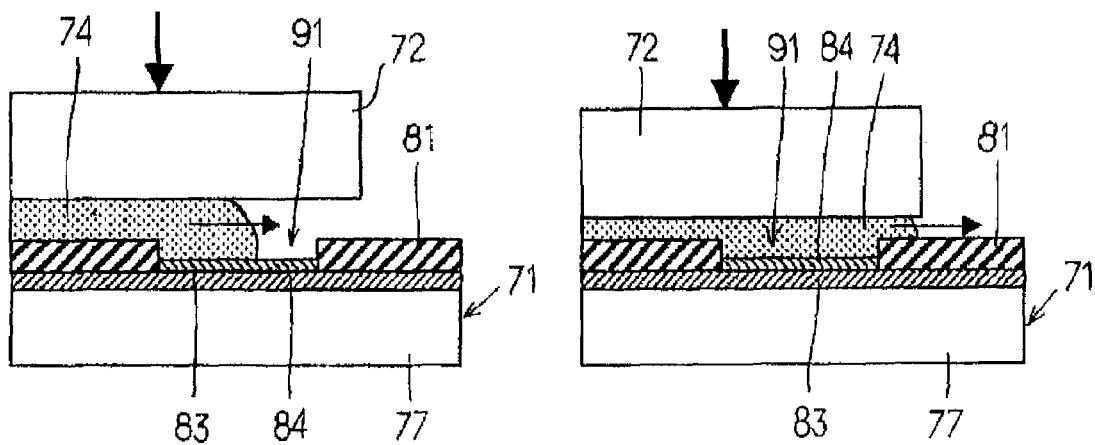

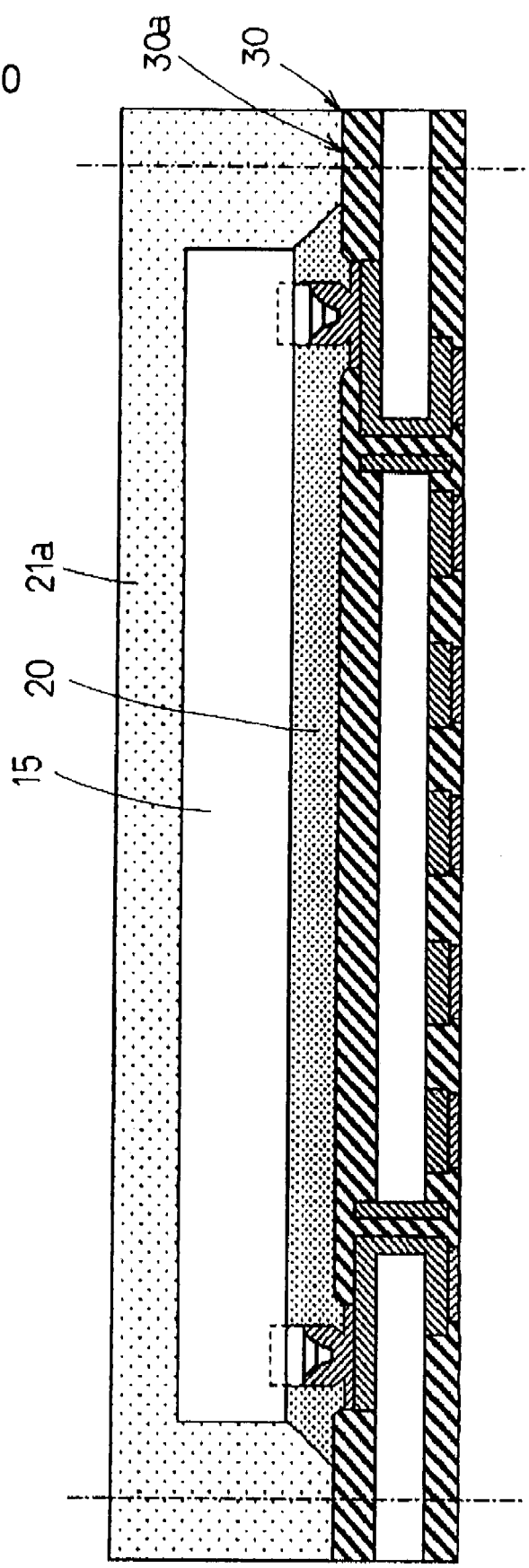

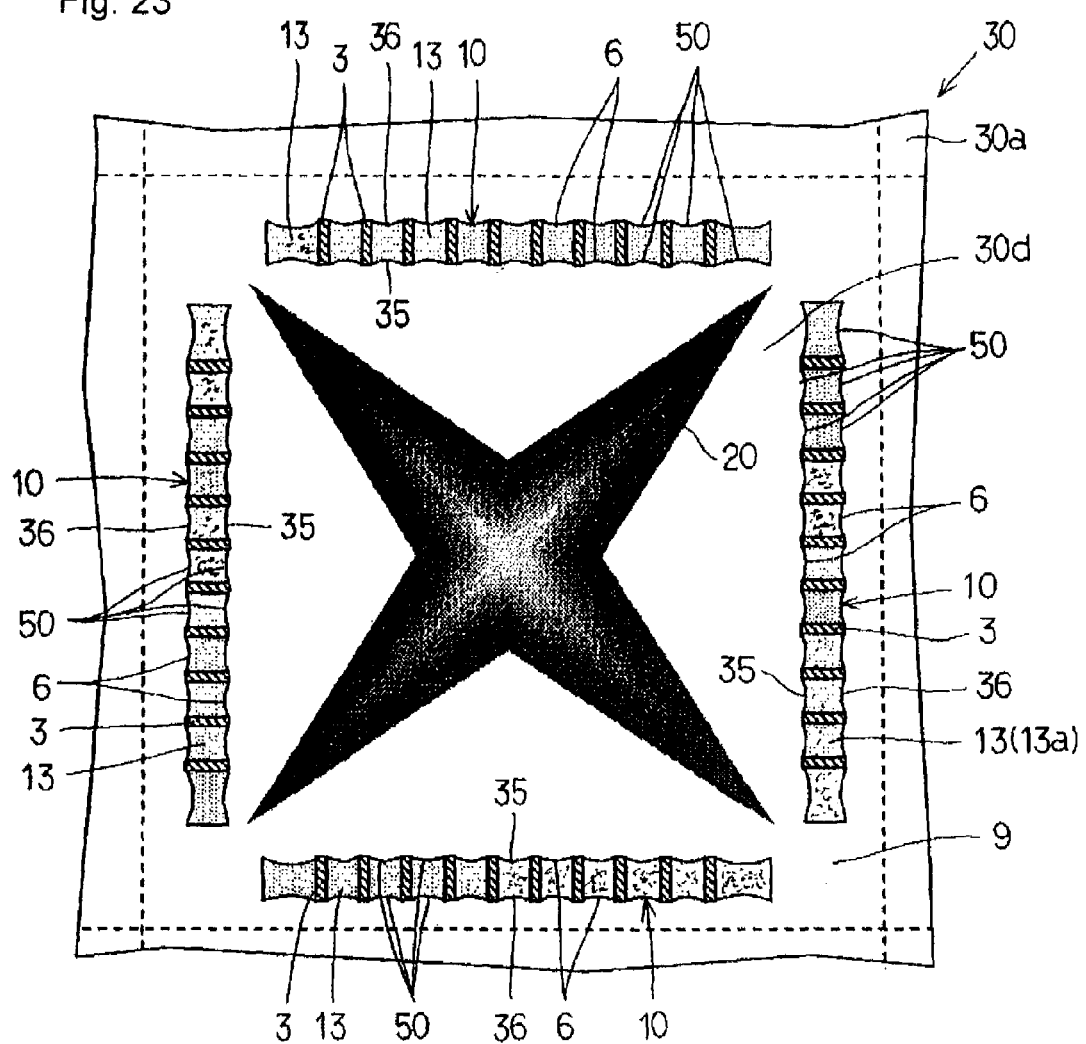

SEMICONDUCTOR DEVICE AND METHOD OF MANUFACTURING SEMICONDUCTOR DEVICE

This application is based upon and claims the benefit of priority from Japanese Patent Application No. 2006-047954 filed on Feb. 24, 2006, the contents of which is incorporated by reference.

BACKGROUND OF THE INVENTION

1. Field of the Invention

The present invention relates to a semiconductor device and a method of manufacturing the semiconductor device, and more particularly, to techniques which are effectively applied to a technique for filling an insulating underfill resin in an interstice between a wiring board and a semiconductor chips which is flip chip connected to the wiring board.

2. Description of the Related Art

As one semiconductor device, a so-called flip chip connection structure is known, where a semiconductor chip is mounted on wires routed on one surface of a wiring board through salient electrodes placed thereon. External electrode terminals are disposed on the other surface of the wiring board. As one flip chip connection structure, JP-A-2000-77471 discloses an example in which gold bump electrodes (gold stud electrodes) disposed on one surface of a semiconductor chip are flip chip mounted to bar-shaped wires (conductor pattern) routed on the top surface of a wiring board through solder.

Patent Document 1 describes a structure which has a connection conductor pattern arranged on a flip chip mounting board, which is made up of a wiring pattern which serves as wires, and connection pads formed continuously to the wiring pattern at positions at which bumps are bonded and having a width wider than the width of the wiring pattern. In this way, when a connection medium (solder) applied on the connection conductor pattern is melted, the solder converges on the connection pads into a lump shape, at the same time the wiring pattern is being formed with a thin film of the connection medium. The bumps are connected to the aforementioned lump-shaped portions.

On the other hand, JP-A-2005-327947 discloses a method for flip chip connecting a semiconductor chip to a wiring board, which involves previously coating an underfill resin on portions of the wiring board, opening up the underfill resin with the semiconductor chip when it is flip chip connected, and filling the interstice between the wiring board and semiconductor chip with the underfill resin.

In semiconductor devices such as CSP (Chip Size Package), BGA (Ball GRid Array) and the like, a structure for flip chip connecting a semiconductor chip on a wiring board is often used in order to reduce the size and thickness of the semiconductor devices. Also, in order to improve the resistance of semiconductor devices to humidity, a structure is employed for filling an interstice between a wiring board and a semiconductor chip with an insulating resin (underfill resin).

A conventional BGA-type semiconductor device has a structure as illustrated in FIG. 1. FIG. 1 illustrates a schematic diagram of the general structure of a BGA-type semiconductor device. Semiconductor device 70 comprises wiring board 71 made, for example, of a glass epoxy resin board, and semiconductor chip 72 electrically connected to the top surface of wiring board 71 through a flip chip connection. Salient electrodes 73 of semiconductor chip 72 are electrically connected to wires (connection pads), not shown. An interstice between semiconductor chip 72 and wiring board 71 is filled with underfill resin 74. Semiconductor chip 72, underfill resin 74 and the like are covered with sealant 75 formed over wiring board 71 and made of an insulating resin. A plurality of external electrode terminals 76 are disposed on the bottom surface of a wiring board.

FIG. 2 illustrates an enlarged cross-sectional view of an end portion of semiconductor device 70 in greater detail. Wiring board 71 has wires 78, 79, respectively, on the top surface and bottom surface of core board 77 made of an insulating glass epoxy resin board. These wires 78, 79 are electrically connected at required locations through conductors 80 extended through board core 77. Also, insulating solder resist films 81, 82 are selectively disposed on the top and bottom surfaces of board core 77. Solder resist films 81, 82 fill up even throughholes in which conductors 80 are formed.

Solder layer 84 is formed on a portion of wire 78 exposed from solder resist film 81 on the top surface of board core 77, and salient electrode 73 of semiconductor chip 72 is fixed on solder layer 84 with solder 86. Salient electrode 73 is formed on the surface of electrode 85 of semiconductor chip 72. In a broader sense, an electrode, when so called, includes salient electrode 73 and electrode 85 as well. As illustrated in FIG. 3, wires 78 are structured to be partially exposed in openings 91 formed by opening solder resist film 81 which was formed on the top surface of board core 77, in an elongated shape. Openings 91 are formed along respective side of square wiring board 71 which includes elongated grooves. Also, a plurality of wires 78 disposed on the bottom of respective openings 91 extend in parallel along a width direction of rectangular openings 91. FIG. 3 omits the illustration of solder layer 84 on the surface of wire 78. A central portion of elongated wire 78 serves as connection pad 83. For convenience, circles are shown in openings 91 formed along the top side of the square illustrated in FIG. 3. These circular areas are those portions at which salient electrodes 73 of semiconductor chip 72 are connected to connection pads 83. To facilitate the understanding, the circles are labeled with the reference numeral of salient electrode 73 for convenience.

Also, as illustrated in FIG. 2, solder layer 88 is formed on top of a portion (connection 87) of wire 79 exposed from solder resist film 82 on the bottom surface of board core 77, and solder ball electrode 89 is fixed on solder ball electrode 89. External electrode terminal 76 is formed by this solder ball electrode 89. In this connection, external electrode terminal 86 is simply called the electrode as well.

Prior to the flip chip connection, an underfill resin (not shown) is selectively coated inside of a frame-shaped portion formed by four openings 91 shown in FIG. 3. Subsequently, as illustrated in FIG. 4A, semiconductor chip 72 is moved down, and semiconductor chip 72 is pressed onto wiring board 71 (see a bold arrow). As a result, underfill resin 74 on wiring board 71 is squeezed by the top surface of semiconductor chip 72 to spread over the top surface of wiring board 71, and flows into openings 91 from solder resist film 81, as indicated by a thin arrow. Also, since underfill resin 74 spreads further, underfill resin 74 spreads from opening 91 onto solder resist film 81, as illustrated in FIG. 4B.

In such flip chip connection, air bubble (void) can sometimes occur in underfill resin 74 filled between wiring board 71 and semiconductor chip 72, as illustrated in FIG. 1.

As a result of analyzing and considering the spreading of underfill resin 74, the inventors found the following fact. Specifically, underfill resin 74 spreads at different speeds (moving speeds) on the surface of board core 77 that is made of a glass epoxy resin and on the surface of solder layer 84 which is a metal, where the speed is higher than on a surface made of glass epoxy resin. Accordingly, a head portion of the underfill resin flows faster on the metal surface area, as compared with the area of board core 77, causing disturbance in the head portion. This disturbance in the moving speed of the underfill resin causes air to be caught up in the head portion, making air bubble (void) 90 more likely to occur.

FIG. 5 illustrates a portion of openings 91. This figure shows the flowing (spreading) state of underfill resin 74. Openings 91 are arranged in a rectangular frame shape, and underfill resin 74 is coated inside of the rectangular frame, with the result that when underfill resin 74 is pressed down by semiconductor chip 72, underfill resin 74 flows into openings 91 from inside edges 91a of openings 91, and again spreads over solder resist film 81 from outer edges 91b. Since solder layer 84 is made of a metal, its surface is flat and encourages underfill resin 74 to flow thereon. On the other hand, since the surface of board core 77 made of a glass epoxy resin is coarse, as compared with the metal surface, underfill resin 74 moves at a speed lower than that on solder layer 84. Accordingly, as illustrated in FIG. 5, the head portion of flowing underfill resin 74 forms advanced head 92 on solder layer 84, and forms delayed head 93 on board core 77, causing the overall head to be undulated. Then, as larger difference a exists between advanced head 92 and delayed head 93, air is more likely to be caught up. Specifically, as the flow is disturbed, the head portion extends to left and right. As advanced head 92 collides with salient electrode 73 stacked on wire 78, advanced head 92 branches into two parts which flow beside salient electrode 73. In this event, the laterally extending head portion delays and extends in front of delayed head 93, and integrates with the extending portion of advanced head 92 which moves forward alongside, thereby catching up air in the flow of underfill resin 74. As a result, air bubble (void) 90 remains in underfill resin 74 after a curing process.

SUMMARY OF THE INVENTION

It is an object of the present invention to provide a semiconductor device which is structured to prevent air bubble from occurring in an underfill resin between a wiring board and a semiconductor chip, and a method of manufacturing the semiconductor.

The above object and other objects and novel features of the present invention will become apparent from the description of the specification and accompanying drawings.

Representative inventions disclosed in the present application may be generally outlined as follows.

(1) A semiconductor device has at least:

a square wiring board having a board core made of an insulating material, wires made of a metal and formed on a first surface of the board core, a solder resist film formed on the first surface to cover the wires, and openings formed by partially opening the solder resist film, wherein a plurality of the elongated wires are arranged in parallel on the bottom of the openings;

a semiconductor chip having electrodes which flip chip connected to the wires arranged on the bottom of the openings of the wiring board through a conductive bonding material; and an insulating resin for filling an interstice between the wiring board and the semiconductor chip, wherein the wires extend along a width direction orthogonal to a longitudinal direction of the openings, the openings comprise elongated grooves which extend along at least two opposing sides of the square of the wiring board, a pair of opposing edges of the opening along the longitudinal direction define zig-zag edges in which the widths of the opening seem to be longer and shorter in a repeating sequence, and recessed edge portions which recess toward the outside of the opening formed by the zig-zag edges in the width direction correspond to the wires, and protruded edge portions which protrude toward the inside of the opening formed by the zig-zag edges in the width direction correspond to the board core between adjoining the wires.

Such a semiconductor device is manufactured by the steps of:

(a) providing a square wiring board having a board core made of an insulating material, wires made of a metal and formed on a first surface of the board core, a solder resist film formed on the first surface to cover the wires, and a plurality of openings formed by partially opening the solder resist film, wherein a plurality of the elongated wires are arranged in parallel on the bottom of the opening;

(b) coating an insulating resin in an area surrounded by the plurality of openings on the first surface of the wiring board; and (c) pressing a semiconductor chip against the first surface of the wiring board in a state in which electrodes face the first surface to flip chip connect the each electrode to the wire in the openings, and opening up the insulating resin with the semiconductor chip to fill an interstice between the wiring board and the semiconductor chip, wherein in the step (a), when the openings are formed through the solder resist film, the openings are formed as elongated grooves which extend along at least two opposing sides of the wiring board which is square in shape, and the wires are formed to extend in a width direction orthogonal to a longitudinal direction of the openings, a pair of opposing edges of the opening along the longitudinal direction are formed in zig-zag edges in which the widths of the opening seem to be longer and shorter in a repeating sequence, recessed edge portions which recess toward the outside of the opening formed by the zig-zag edges in the width direction are formed to correspond to the wires, and protruded edge portions which protrude toward the inside of the opening formed by the zig-zag edges in the width direction are formed to correspond to the board core between adjoining ones of the wires.

(2) In the configuration of the aforementioned (1), the zig-zag edge is an edge undulated in a wavy shape.

Effects produced by representative inventions disclosed in the present application may be generally outlined as follows.

According to means of the aforementioned (1), (a) the electrodes of the semiconductor chip, which is flip chip connected to the wiring board, are electrically connected to the elongated wires based on an operation in which the underfill resin that is partially coated on the surface of the wiring board is squeezed by the semiconductor chip. The wires are elongated, and positioned on the bottom of the opening defined by an elongated groove formed through the solder resist film disposed on the surface of the wiring board. In the flip chip connection, the underfill resin, which is squeezed and flows, enters into the opening from the solder resist film, flows, goes out of the opening, and again flows onto the solder resist. In this event, the underfill resin flows along the direction in which the elongated wires extend in the opening. The underfill resin flows (moves) at a speed higher on the surface of wires made of metal, than on the surface of the board core made of glass epoxy resin. Also, since the recessed edge portions which recess toward the outside of the opening formed by the zig-zag edges in the width direction correspond to the wires, while the protruded edge portions which protrude toward the inside of the opening in the width direction correspond to the board core between the adjoining wires, the opening width above the wires is longer than the opening width above the board core. Also, the underfill resin flowing on the solder resist film flows into the opening when a predetermined amount flows over the entire zig-zag edge of the opening. As a result, the underfill resin moves forward on the wires for a longer distance compared with the distance that the underfill resin moves forward on the board core. Accordingly, since the head portions of the flowing underfill resin move forward without a large difference between that on the wire and that on the board core, a small difference in the distance traveled by the resin therebetween makes air less likely to be caught up which would otherwise happen as a result of heads portions of the underfill resins being disturbed. Consequently, it is possible to manufacture a semiconductor device which obviates air bubble (void) from occurring in the underfill resin layer.

Likewise, in means of the aforementioned (2), the edges of the opening are undulated zig-zag edges in a manner similar to the means (1), and the length of the opening portions overlying the wires is longer as compared with the length of the opening portions overlying the board core. As a result, the underfill resin moves forward on the wires over a longer moving distance as compared with a moving distance of the underfill resin which moves forward on the board core. Accordingly, since the head portions of the flowing underfill resin move forward without a large difference in the distance between that on the wires and that on the board core, a small difference in distance traveled by the resin therebetween makes air less likely to be trapped which would otherwise happen as a result of head portions of the underfill resins being disturbed. Consequently, it is possible to manufacture semiconductor device 1 which obviates air bubble (void) from occurring in the underfill resin layer.

The above and other objects, features and advantages of the present invention will become apparent from the following description with reference to the accompanying drawings which illustrate examples of the present invention.

BRIEF DESCRIPTION OF THE DRAWINGS

FIG. 3 is a schematic diagram illustrating a portion of the connection pad to which salient electrodes of a semiconductor chip are connected in the semiconductor device of FIG. 1;

FIG. 4A, FIG. 4B are cross-sectional views schematically illustrating the spreading state of the underfill resin when a semiconductor chip is flip chip connected to a wiring board according to the method of manufacturing the semiconductor device of FIG. 1;

FIG. 20 is a cross-sectional view illustrating a state in which a resin layer is formed to cover the semiconductor chip on the first surface of the product forming area in a step of manufacturing the semiconductor device of Embodiment 1;

FIG. 23 is a plan view illustrating a first surface of a product forming area of a wiring mother board used in a method of manufacturing a semiconductor device according to Embodiment 2.

DESCRIPTION OF THE PREFERRED EMBODIMENTS

Figure 1:
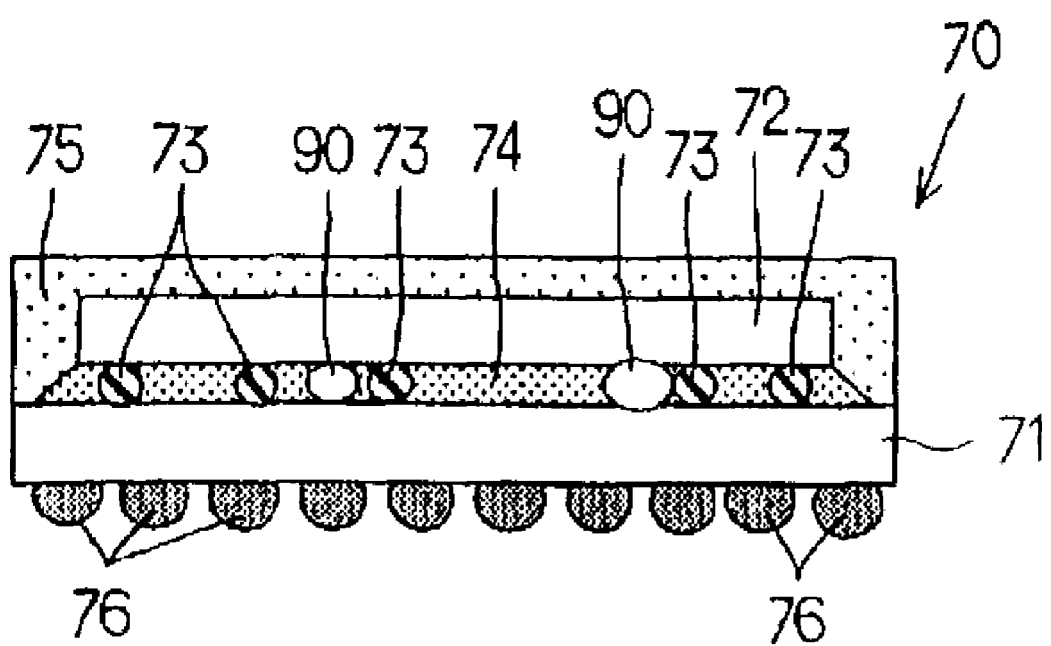
FIG. 1 is a cross-sectional view schematically illustrating a conventional BGA-type semiconductor device.
Figure 2:
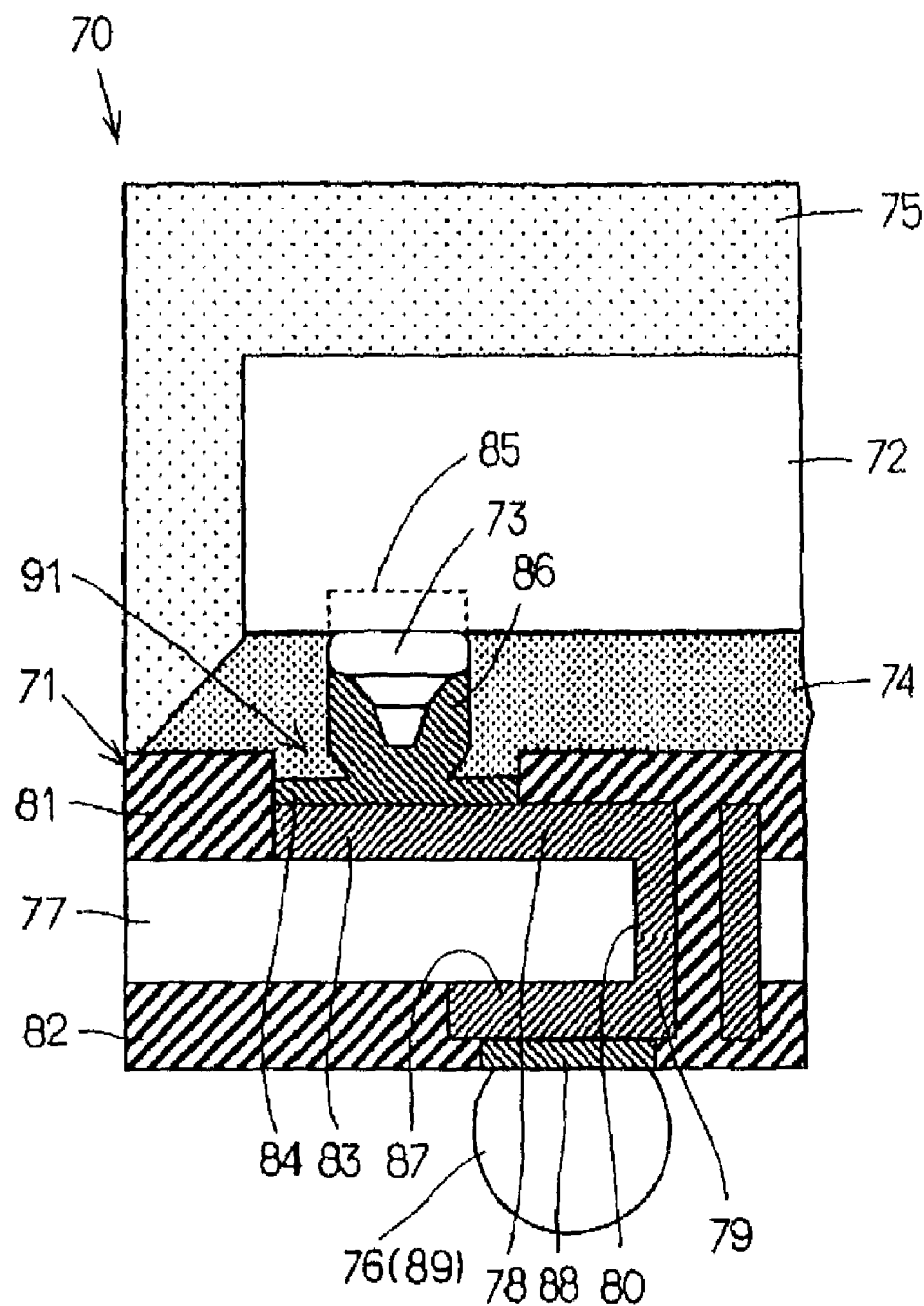
FIG. 2 is a cross-sectional view illustrating a portion of the semiconductor device in FIG. 1 under magnification.

In all drawings for describing embodiments of the present invention, those having the same function are designated the same reference numeral, and repeated descriptions thereon are omitted.

Embodiment 1

Figure 6:
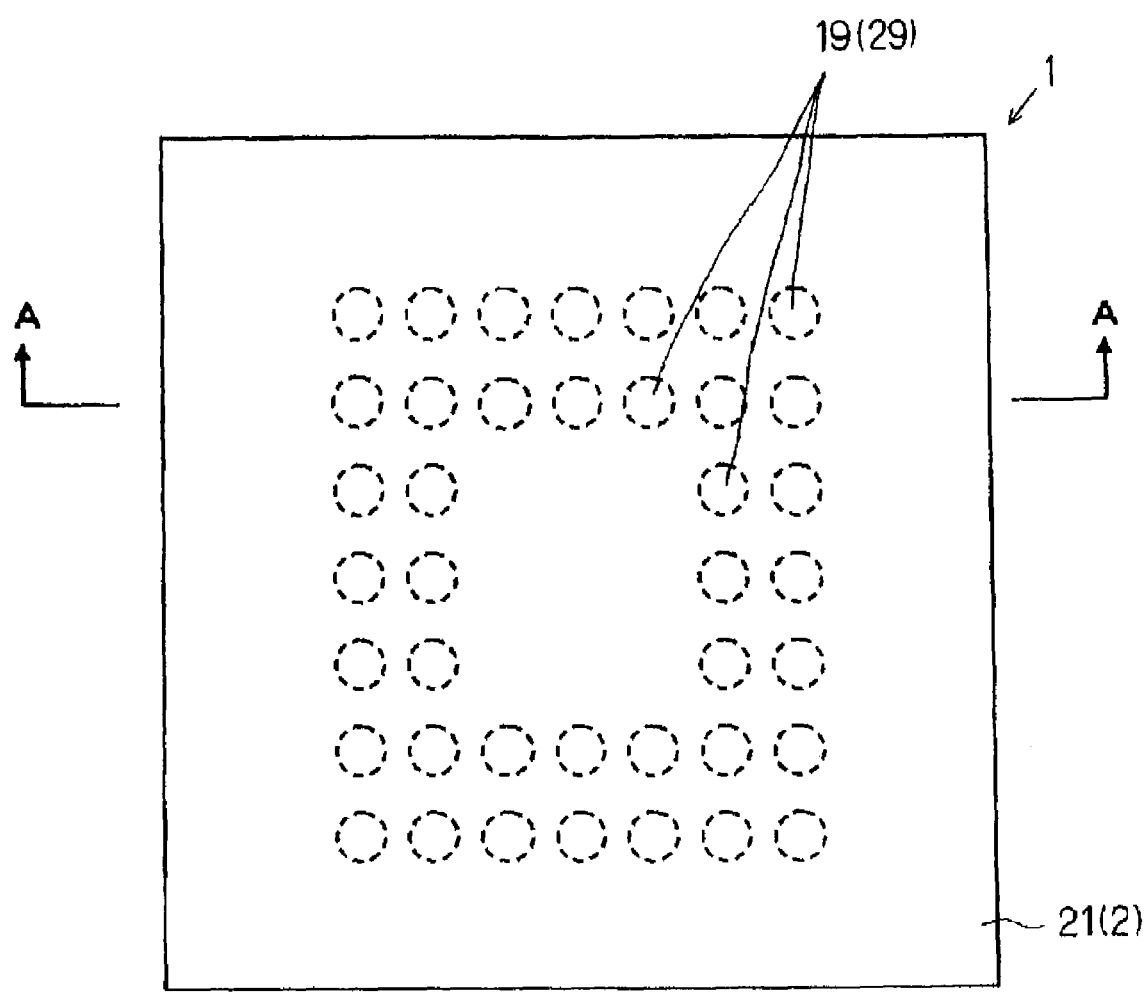
FIG. 6 is a plan view illustrating a semiconductor device of Embodiment 1.
Figure 7:
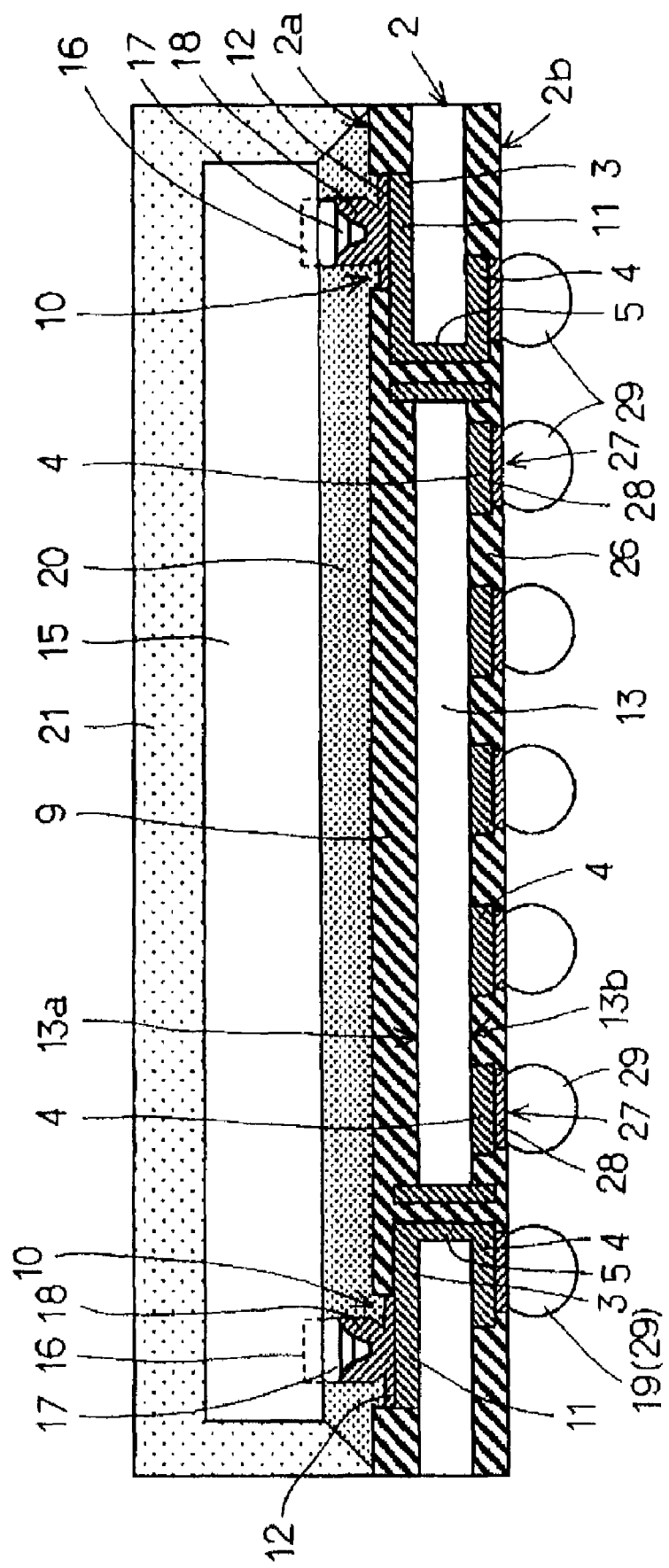
FIG. 7 is an enlarged cross-sectional view taken along an A-A line in FIG. 6.
Figure 8:
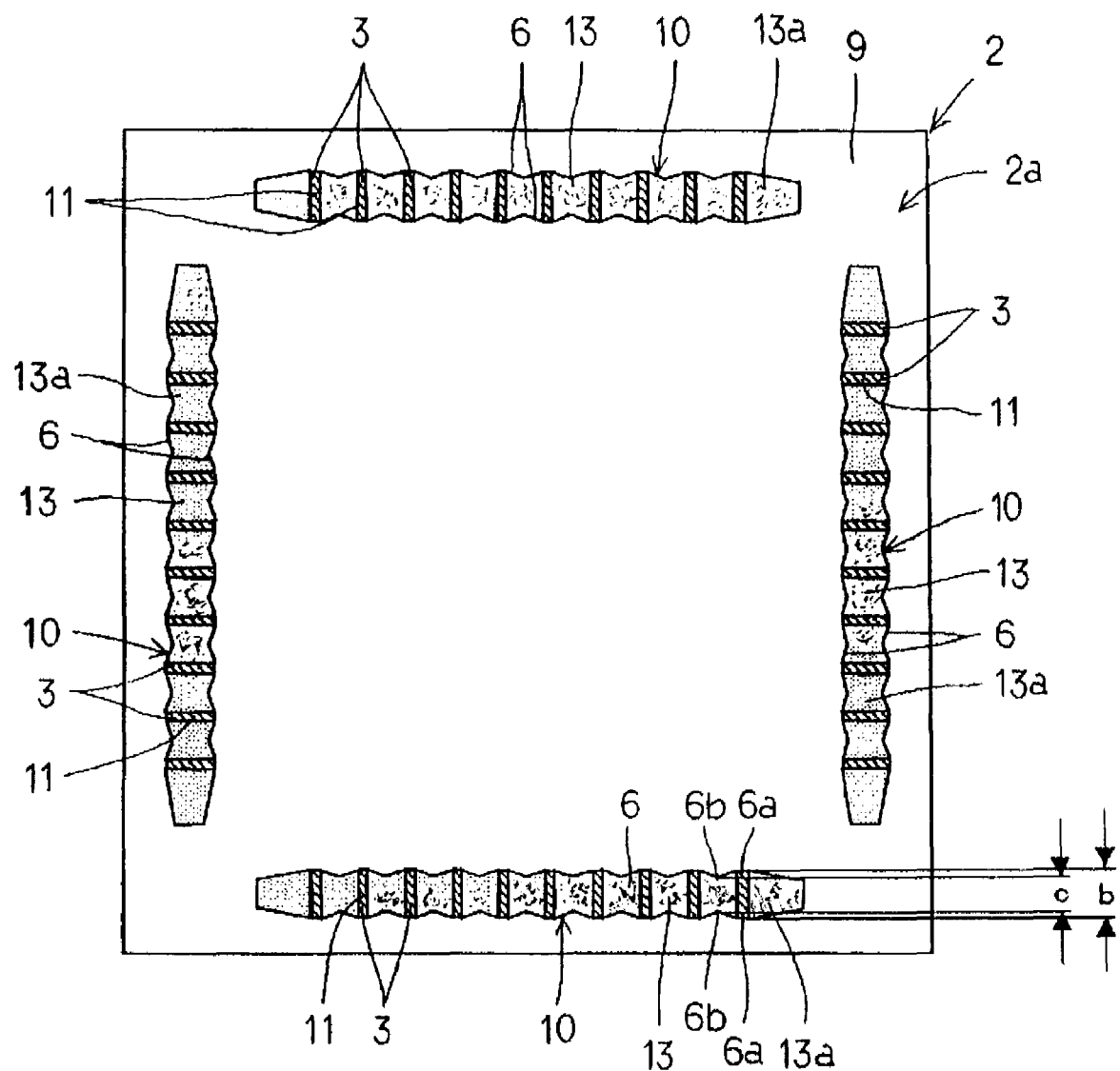
FIG. 8 is a plan view illustrating a wiring board of the semiconductor device of Embodiment 1.
Figure 9:
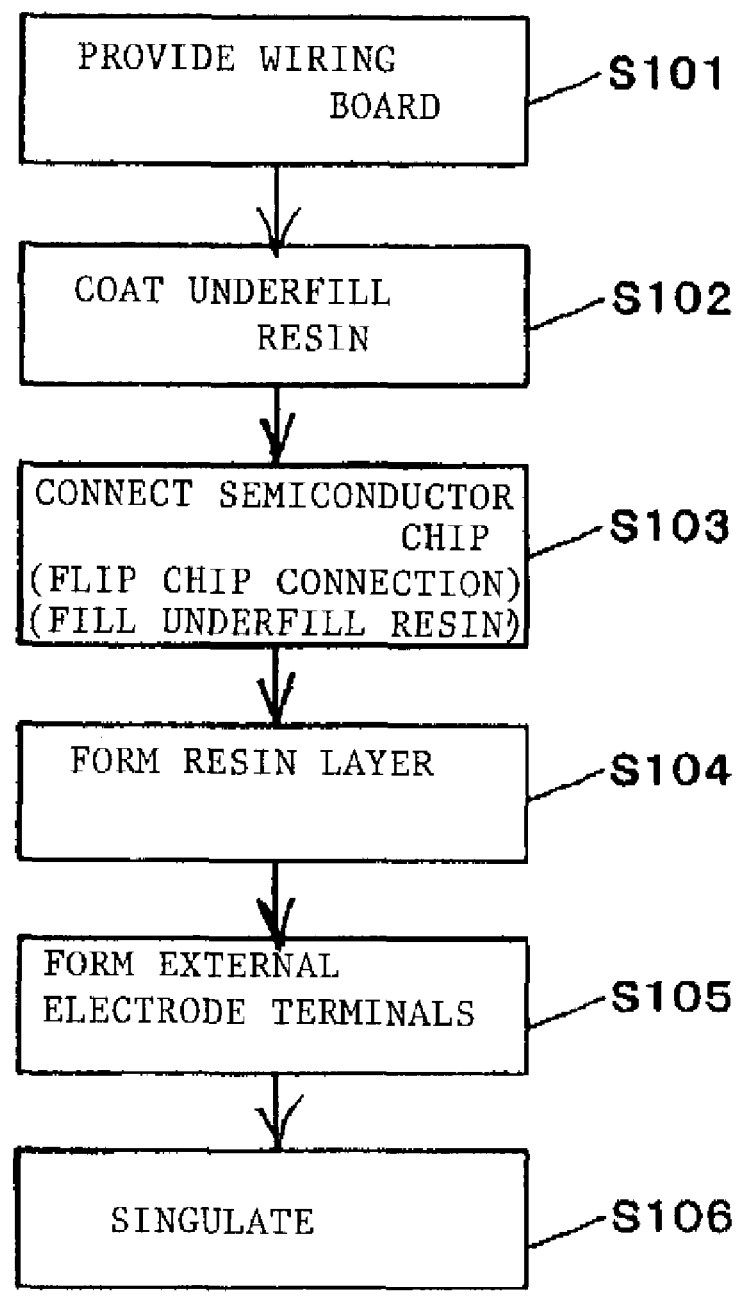
FIG. 9 is a flow chart illustrating a method of manufacturing the semiconductor device of Embodiment 1.

FIGS. 6 to 22 are diagrams related to a semiconductor device and a method of manufacturing the same, according to Embodiment 1 of the present invention. FIGS. 6 to 8 are diagrams related to the structure of the semiconductor device, while FIGS. 9 to 22 are diagrams related to the method of manufacturing the semiconductor device.

In Embodiment 1, a description will be given of an example in which the present invention is applied to a BGA-type semiconductor device and a method of manufacturing the same. Semiconductor device 1 has a structure as illustrated in FIGS. 6 to 8. FIG. 6 is a plan view of the semiconductor device, FIG. 7 is an enlarged cross-sectional view taken along an A-A line, and FIG. 8 is a plan view schematically illustrating a first surface of a wiring board of the semiconductor device.

Semiconductor device 1 of Embodiment 1 has square wiring board 2, as illustrated in FIGS. 6 and 7. As illustrated in FIG. 7, this wiring board 2 is made of a glass epoxy resin wiring board having a thickness of approximately 0.1 mm, and has wires 3, 4 in predetermined patterns on first surface (top surface in FIG. 7) 2a and second surface (bottom surface in FIG. 7) 2b. Specifically, as illustrated in FIG. 7, board core 13 made of a glass epoxy resin has wires 3 on first surface 13a and has wires 4 on second surface 13b. Also, at least parts of these wires 3, 4 are electrically connected through conductors (wires) which extend through the top and bottom surfaces of board core 13. Wires 3, 4 and conductor 5 are formed, for example, of copper. Wires 3, 4 are formed, for example, in a thickness of approximately 15 microns.

First surface 2a of wiring board 2 is covered with insulating film (solder resist film) 9 having a thickness of approximately 35 microns, by way of example. Solder resist film 9 is partially opened, and is provided with openings 10. From the fact that the thickness of solder resist film 9 is approximately 35 microns, openings 10 have a depth of approximately 35 microns. Four openings 10 are provided on second surface 2a of square wiring board 2 illustrated in FIG. 8. Openings 10 comprise elongated grooves which are positioned along the respective sides of wiring board 2 and are arranged such that they define a rectangular frame shape as a whole.

As illustrated in FIG. 8, first surface 13a of board core 13 is exposed on the bottom of openings 10, and a plurality of wires 3 having a thickness of approximately 15 microns, for example, are arranged side by side in parallel with one another. Wires 3 extend along a width direction orthogonal to a longitudinal direction of openings 10. In FIG. 8, board core 13 is indicated by slightly shaded portions, while wires 3 are indicated by elongated portions by hatching. Wires 3 have their surfaces covered with solder layer 12 having a thickness of approximately 15 microns, as illustrated in FIG. 7. Central portions of wires 3 serve as connection pads 11 when electrodes of a semiconductor chip are flip chip connected.

Also, as illustrated in FIG. 8, a pair of opposing edges of opening 10 along the longitudinal direction defines zig-zag edges 6 in which the widths of the opening seem to be longer and shorter in a repeating sequence, which is a feature of the present invention. Although it does not have any particular limitations, this zig-zag edge 6 is a linearly bent edge.

Also, recessed edge portion 6a which recesses toward the outside in the width direction of opening 10 formed by zig-zag edges 6 corresponds to (is positioned on) wire 3. Protruded edge portion 6b which protrudes toward the inside in the width direction of opening 10 formed by zig-zag edges 6 corresponds to (is positioned on) core board 13 between adjoining wires 3. Therefore, in the width of the opening formed by a pair of opposing zig-zag edges 6, spacing (opening width) b between the recessed leading ends of a pair of opposing recessed edge portions 6a is longer (wider) than spacing (opening width) c between the protruded ends of a pair of opposing protruded edge portions 6b.

Also, as illustrated in FIG. 7, semiconductor chip 15 is flip chip connected on first surface 2a of wiring board 2. Semiconductor chip 15 is provided with electrodes 16 on one surface (bottom surface in FIG. 7) thereof, and salient electrodes 17 are disposed to overlie electrodes 16. In a broader sense, an electrode, when so called, also includes electrode 16 and salient electrode 17. Also, although it has no particular limitations, salient electrode 17 is formed of a gold stud electrode which is formed by connecting a gold wire to electrode 16 by nail head bonding, and subsequently cutting the wire near a junction.

The electrodes (salient electrodes 17) of semiconductor chip 15 are connected to connection pads 11 (wire 3) by bonding material 18. Solder, for example, is used as bonding material. An interstice between the bottom surface of semiconductor chip 15 and the surface of solder resist film 9 is, for example, approximately 50 microns.

Also, the interstice between the bottom surface of semiconductor chip 15 and the surface of solder resist film 9 is filled with insulating resin (underfill resin 20). The underfill resin, although it has no particular limitations, for example, of an epoxy-based resin. Its properties are as follows. The largest diameter of filler included in the resin is equal to or less than 1 microns. Coefficient d1 of thermal expansion (coefficient of thermal expansion at a room temperature) is 28 ppm/° C., and coefficient d2 of thermal expansion (coefficient of thermal expansion at a glass transition temperature) is 95 ppm/° C. Also, the bending strength is 100 Mpa, and the bending elastic modulus is 6.3 pa.

Also, sealant 21 is formed on first surface 2a of wiring board 2 by an insulating resin, for example, an epoxy resin. Sealant 21 covers semiconductor 15 and underfill resin 20. Also, sealant 21 has its outside shape conform to wiring substrate 2.

On the other hand, insulating film (solder resist film) 26 having a thickness of approximately 35 microns is disposed on second surface 2b of wiring board 2 to cover wire 4, as illustrated in FIG. 7. Solder resist film 26 is formed with a plurality of electrode forming holes 27. Wires 4 are positioned on the bottom of electrode forming holes 27. Also, solder layer 28 is provided on the surfaces of wires 4 in electrode forming hole 27. Then, salient electrodes 29 are formed by this solder layer 28 in electrode forming holes 27. Salient electrodes 29 are formed by ball-shaped solder electrodes (for example, PbSn solder balls). These salient electrodes 29 constitute external electrode terminals 19 of semiconductor device 1, and are arranged at a predetermined pitch along each side of square wiring board 2, as illustrated in FIGS. 6 and 7. In this way, semiconductor device 1 works out to be a BGA-type semiconductor device. In FIG. 6, circles drawn in dotted lines represent external electrode terminals 19 (salient electrodes 29). The solder resist thoroughly fills in even the insides of throughholes provided for forming conductors (wire) 5 to couple overlying solder resist film 9 to underlying solder resist film 26.

Next, a method of manufacturing semiconductor device 1 of Embodiment 1 will be described with reference to FIGS. 9 to 22. As illustrated in a flow chart of FIG. 9, the semiconductor device of Embodiment 1 is manufactured through the respective steps of providing a wiring board (wiring mother board) (S101), coating an underfill resin (S102), connecting a semiconductor chip (flip chip connection, filling of an underfill resin: S103), forming a resin layer (S104), forming external electrode terminals (S105), and singulating the wiring mother board (S106).

Figure 10:
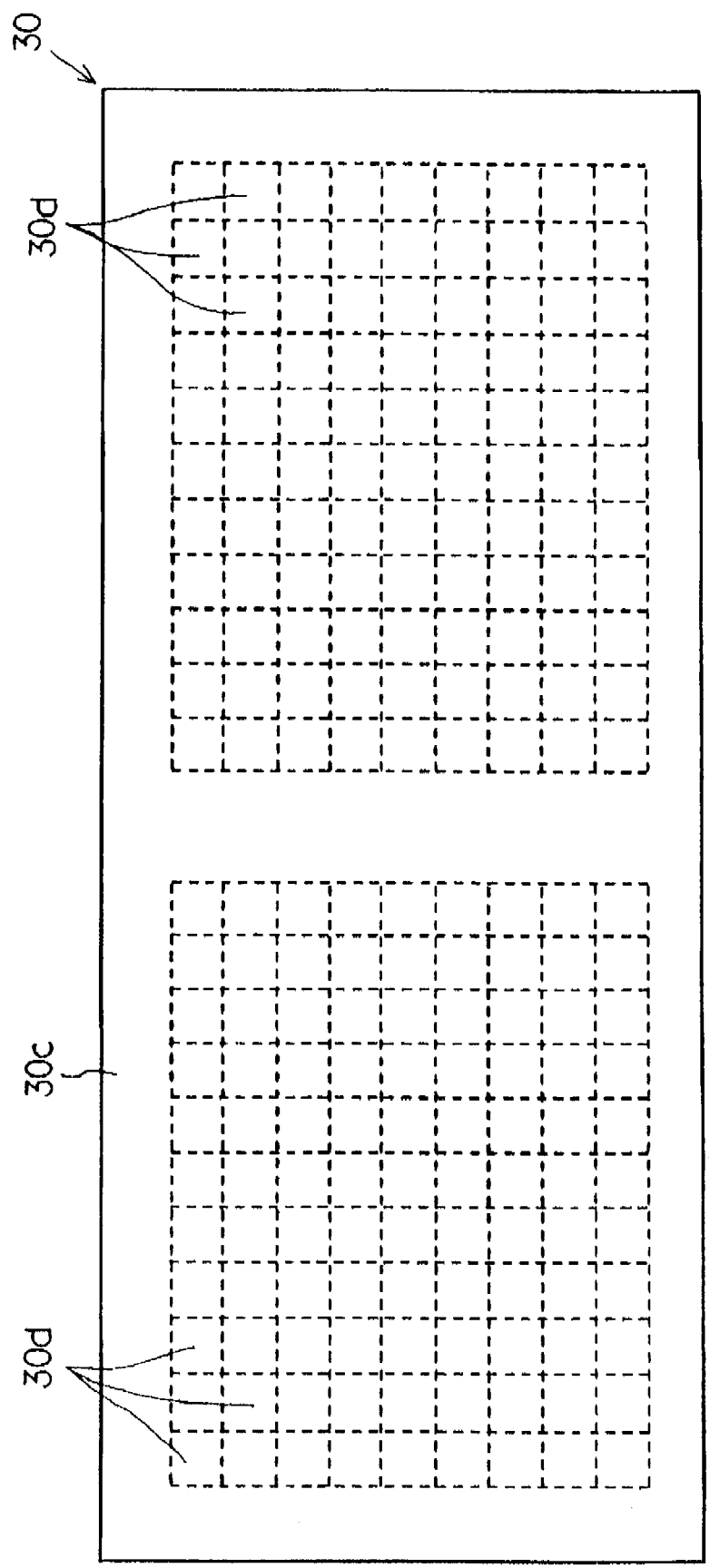
FIG. 10 is a plan view schematically illustrating a wiring mother board used in a step of manufacturing the semiconductor device of Embodiment 1.

In the steps of manufacturing semiconductor device 1, a wiring board is provided (S101), as shown in FIG. 10. This wiring board is structured to have wiring boards 2, described in connection with FIGS. 6 to 8, vertically and horizontally arranged and coupled to each other (matrix). Accordingly, this wiring board is specifically called "wiring mother board 30." Although it has no particular limitations, wiring mother board 30 is structured to have two matrixes arranged side by side. A portion outside of the matrixes defines frame portion 30c. In the matrix, square portions surrounded by dotted-line frames define product forming areas 30d which are cut along the dotted lines to provide wiring substrates 2.

Figure 11:
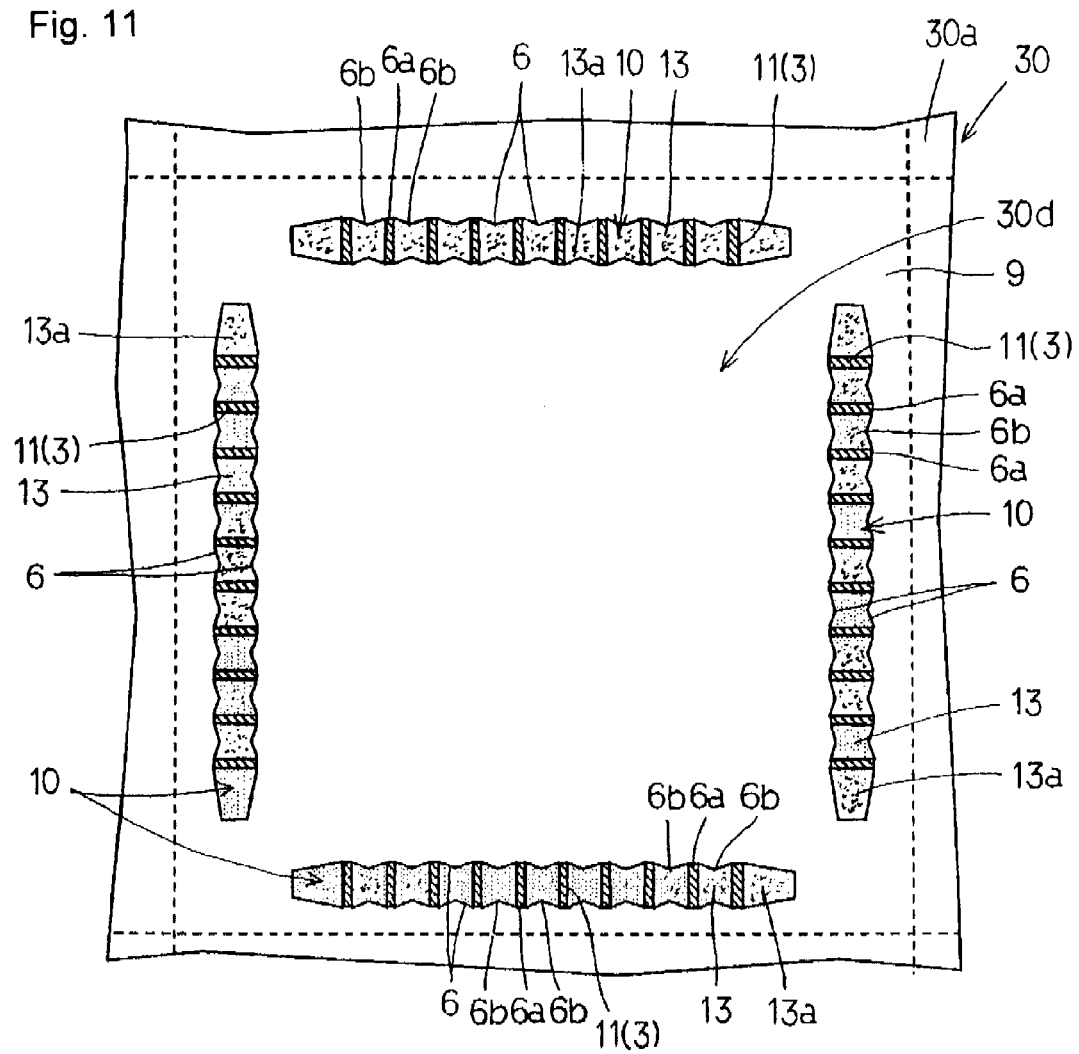
FIG. 11 is a plan view illustrating a product forming area of the wiring mother board under magnification.

FIG. 11 illustrates a state of product forming area 30d in an enlarged view, which illustrates first surface 30a of wiring mother board 30. A square portion surrounded by dotted lines is product forming area 30d. While first surface 30a of product forming area 30d is covered with insulating film (solder resist film) 9, openings 10 are formed such that connection pads 11 of wires 3 are exposed in order to electrically connecting salient electrodes 17 of semiconductor chip 15 thereto. Openings 10 are formed through solder resist film 9 by a general photolithography technology and etching technology. Hatched portions shown along a width direction orthogonal to a longitudinal direction of opening 10 represent wires 3, and connection pad 11 is formed at a portion closer to the center of wire 3. A slightly shaded portion within opening 10 represents a surface portion (first surface 13a) of board core 13. Though the illustration is omitted, solder layer 12 having a thickness of approximately 15 microns is disposed on the surface of wires 3.

Product forming area 30d illustrated in FIGS. 11 to 14 is similar in structure to wiring board 2 previously described with reference to FIG. 8. Therefore, a detailed description of product forming area 30d is omitted. As illustrated in FIG. 11, four openings 10 are disposed through first surface 30a of each product forming area 30d. This opening 10 is structured to define an elongated groove, and has a pair of opposing long sides which define zig-zag edges 6 as previously described, with zig-zag edges 6 having recessed edge portions 6a and protruded edge portions 6b. Then, the center line of recessed portion 6a matches the center line of wire 3, while the center line of protruded edge portion 6b matches the center line of a portion of board core 13 which is exposed between adjacent wires 3.

Figure 12:
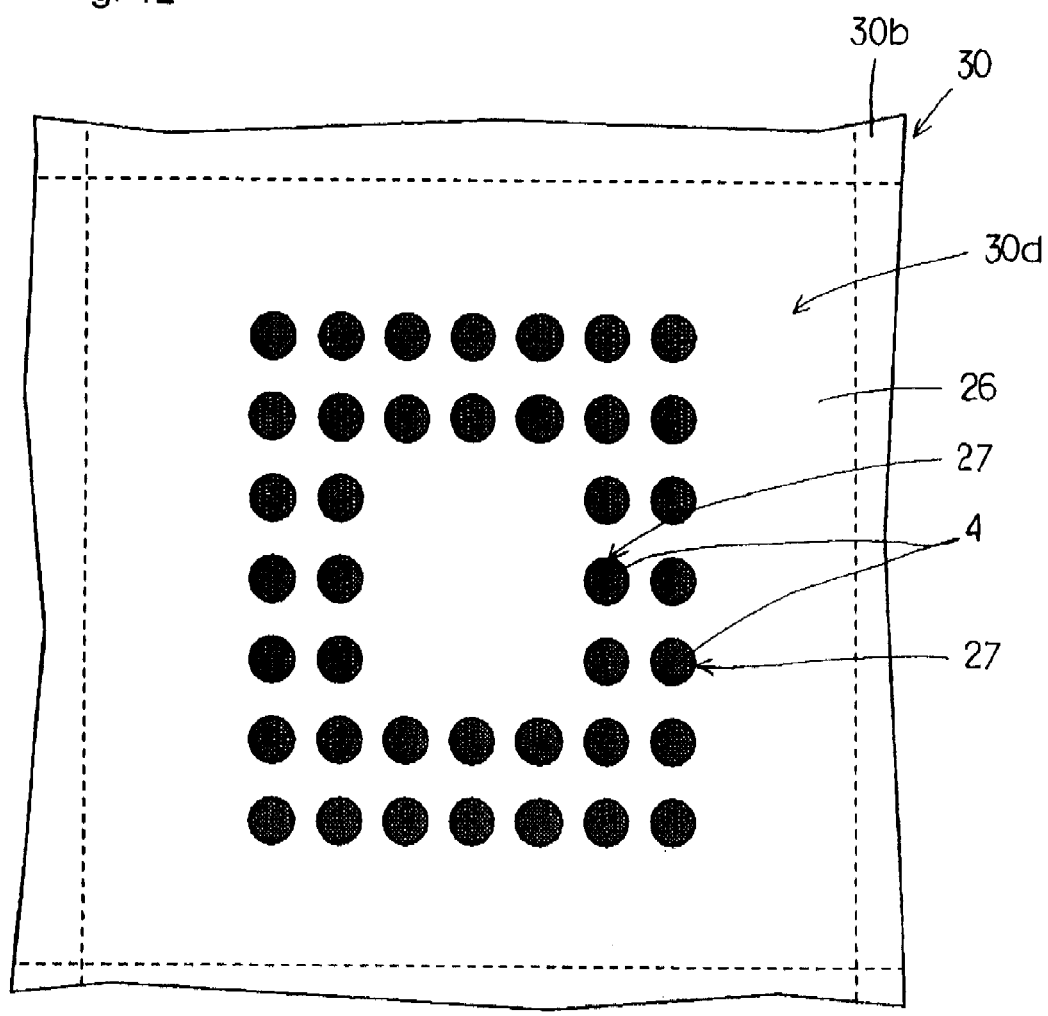
FIG. 12 is an enlarged bottom view illustrating the product forming area of the wiring mother board.

FIG. 12 illustrates a state of product forming area 30 in an enlarged view, and illustrates second surface 30b of wiring mother board 30. A square portion surrounded by dotted lines is product forming are 30d. While second surface 30b of product forming area 30d is covered with solder resist film 36, it is partially removed to provide electrode forming holes 27. Wires 4 are positioned on the bottom of electrode forming holes 27. Though an illustration is omitted, solder layer 28 having a thickness of approximately 15 microns is disposed on the surface of wires 4.

Figure 13:
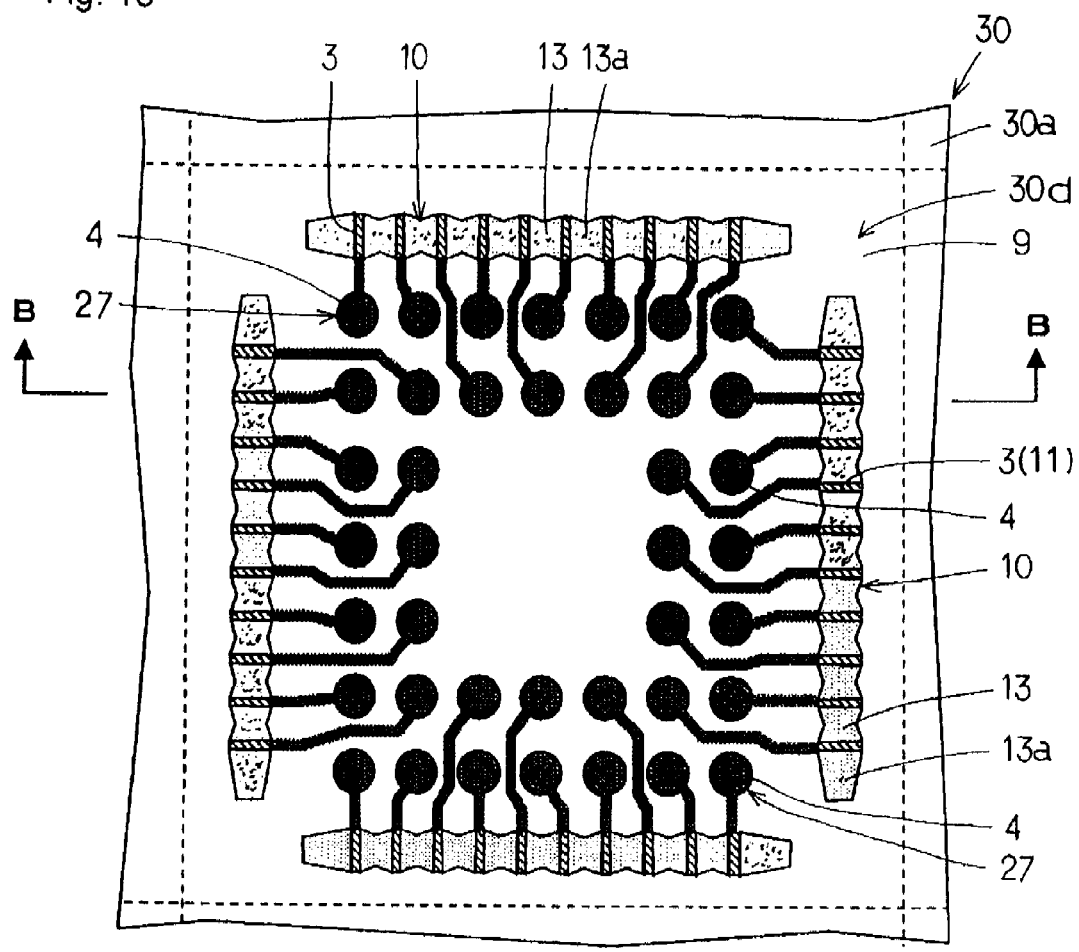
FIG. 13 is a schematic diagram illustrating a connection state of wires in the product forming area.
Figure 14:
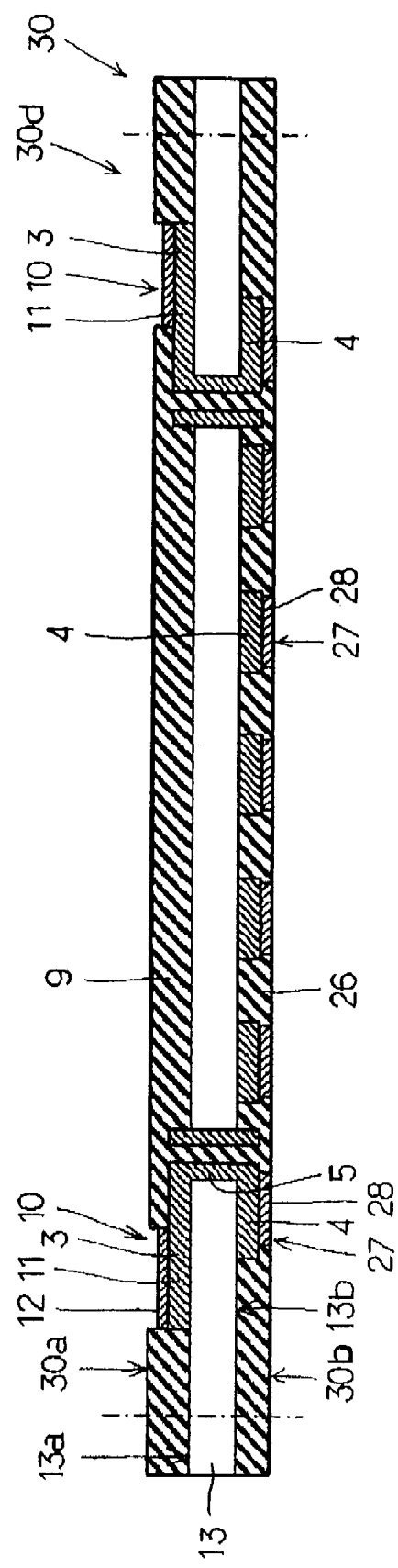
FIG. 14 is an enlarged cross-sectional view taken along a B-B line in FIG. 13.

FIG. 13 is a schematic diagram illustrating a connection relationship between wires 3, 4 on the top and bottom surfaces of product forming area 30d. FIG. 14 is an enlarged cross-sectional view taken along a B-B line. As illustrated in FIGS. 13 and 14, wires 3 positioned on first surface 30a are electrically connected to wires 4 on the bottom of electrode forming holes 27 positioned on second surface 30b. In this connection, product forming area 30d is present between two one-dot chain lines shown to extend through wiring mother board 30 in FIG. 14. In the following illustrations, product forming area 40d is also present between two one-dot chain lines in similar figures.

The steps for manufacturing wiring mother board 30 are based on the following procedure. Although not shown, after board core 13, that has predetermined size and that was formed with throughholes, has been provided, wires 3, 4 in predetermined patterns are formed on first surface 13a and second surface 13b of board core 13, and then, solder resist films 9, 26 are formed over first surface 13a and second surface 13b of board core 13. Subsequently, openings 10 are formed through solder resist film 9 by general photolithography technology and etching technology, and electrode forming holes 27 are formed through solder resist film 26. Next, a plating processing is performed to form solder layers 12, 28 on the surfaces of wires 3, 4. In this way, wiring mother board 30 is manufactured.

Figure 15:
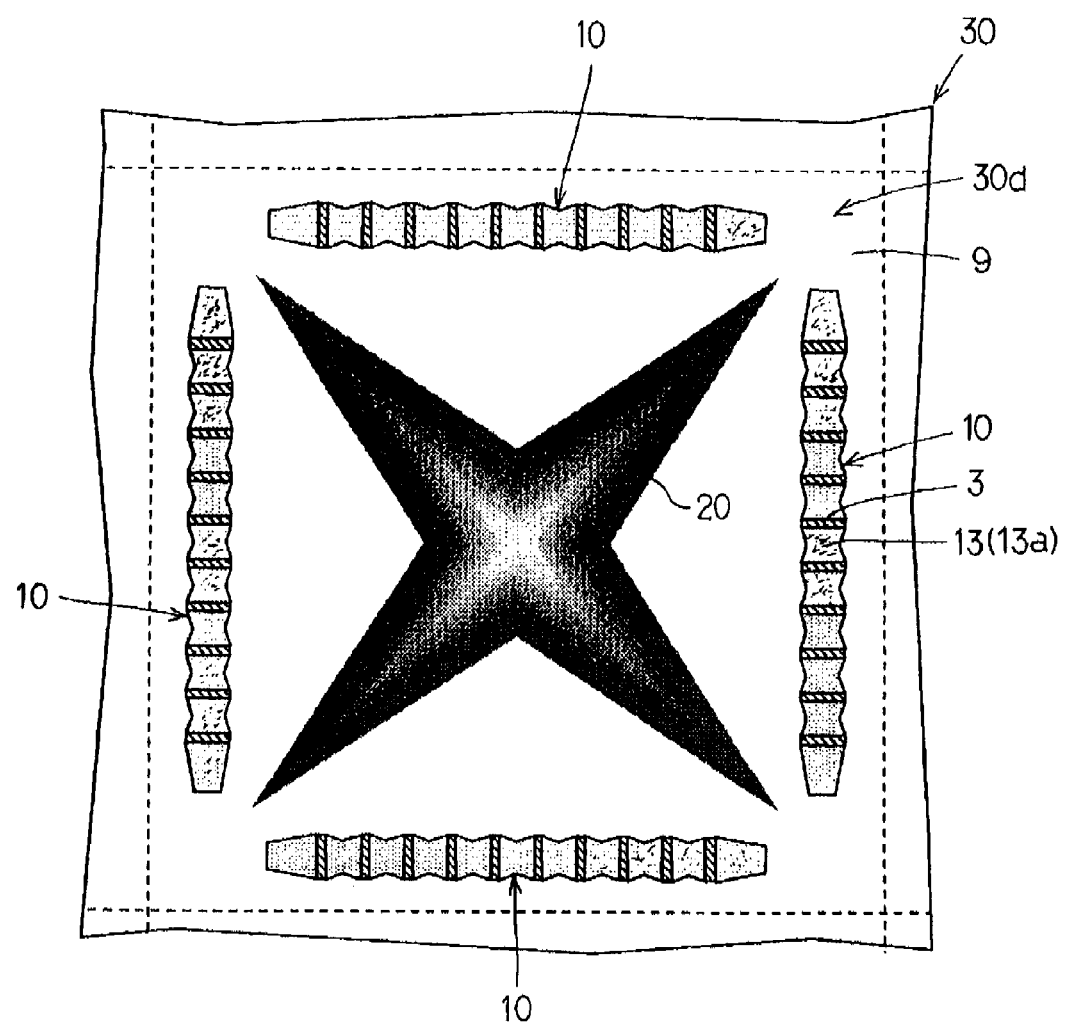
FIG. 15 is a plan view illustrating a state in which the product forming area is partially coated with the underfill resin on a first surface in a step of manufacturing the semiconductor device of Embodiment 1.

Next, as illustrated in FIG. 15, underfill resin 20 (insulating resin, for example, epoxy resin) in a melted state is coated on first surface 30a of each product forming area 30d (S102). This underfill resin 20 is spread by the pressing action of semiconductor chip 15 which spreads the resin on first surface 30a of product forming area 30d to fill an interstice between first surface 30a and semiconductor chip 15. Accordingly, underfill resin 20 must be coated such that it spreads over effectively by pressing semiconductor chip 15. Underfill resin 20 is coated, for example, in an X-shape along the diagonals of square product forming area 30d, as illustrated in FIG. 15. FIG. 15 is a schematic diagram, but actually, straight-line portions that form the letter X have a predetermined width.

Figure 16:
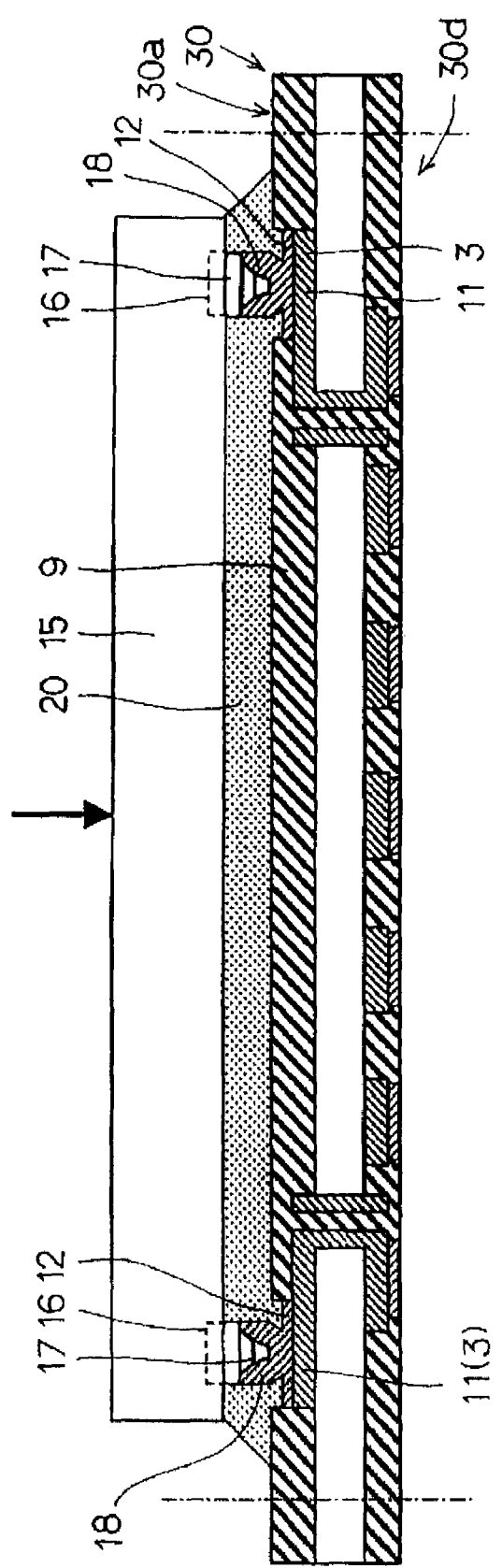
FIG. 16 is a cross-sectional view illustrating a state in which a semiconductor chip is flip chip connected on the first surface of the product forming area in a step of manufacturing the semiconductor device of Embodiment 1.

Next, as illustrated in FIG. 16, in a state in which electrodes (salient electrodes 17) are opposite first surface 30a of each product forming area 30d of wiring mother board 30, semiconductor chip 15 is pressed against underfill resin 20 so that it can be flip chip connected, and so that the interstice between wiring mother board 30 and semiconductor chip 15 is filled with underfill resin 20 (S103).

Semiconductor chip 15 flip chip connected to first surface 30a of each product forming area 30d of wiring mother board 30 is electrically connected to wires 3 (connection pads 11) by an operation of squeezing underfill resin 20 that is partially coated on first surface 30a of product forming area 30d with semiconductor chip 15. In this flip chip connection, underfill resin 20 which, is squeezed and flows, enters from solder resist film 9 into opening 10, flows, moves through opening 10, and again flows onto solder resist film 9 to block (fill) an interstice between wiring mother board 30 and semiconductor chip 15. When underfill resin 20 flows in this way, it moves ahead while bypassing salient electrodes 17 electrically connected to connection pads 11.

Figure 17A:
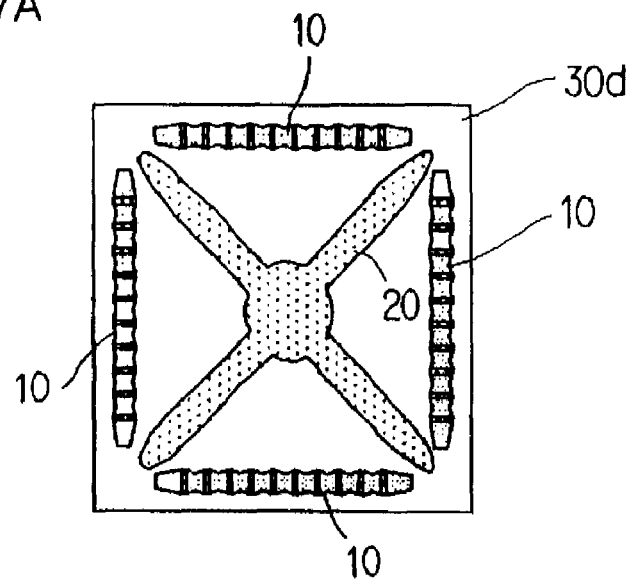
FIG. 17A, FIG. 17B, FIG. 17C are schematic diagrams illustrating the spreading state of the underfill resin during a flip chip connection.
Figure 17B:
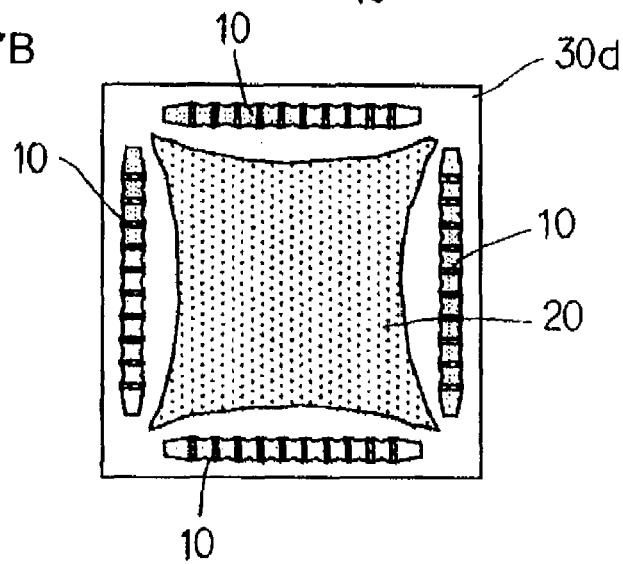
Figure 17C:
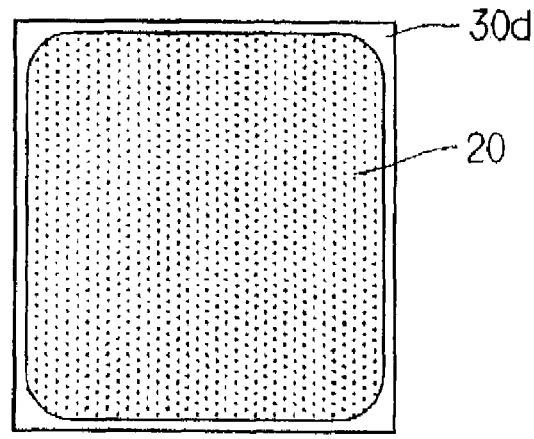

FIG. 17 is a diagram schematically illustrating a state in which underfill resin 20 spreads. As illustrated in FIG. 17A, underfill resin 20, coated in an X-shape in a region inside of four openings 10 arranged in a rectangular frame shape in product forming area 30d, spreads to approach each opening 10, as illustrated in FIG. 17B by semiconductor chip 15 which is pressed thereagainst (pressed down). As semiconductor chip 15 is further continuously pressed, a square area including four openings 10 are covered with underfill resin 20.

FIGS. 18A-18C and FIGS. 19A-19C are partially enlarged schematic diagrams illustrating a flowing state of underfill resin 20 which moves forward beyond openings 10. In these figures, areas hatched with bold lines rising to the right represent solder resist film 9, areas hatched with thin lines falling to the right represent wires 3 (solder layer 12 is omitted), and blank areas between wire 3 and wire 3 represent board core 13 (first surface 13a). Also, areas filled with dots represent underfill resin 20.

In the flip chip connection, underfill resin 20, which is squeezed by semiconductor chip 15 so that it will flow, enters from solder resist film 9 into opening 10 from inside edge 35 of opening 10, flows inside of opening 10, moves out from outside edge 36 of opening 10, and again flows onto solder resist film 9. From the facts that openings 10 are arranged in a square frame shape, that underfill resin 20 is coated in an X-shape in a region inside of the square frame (see FIG. 15), and that underfill resin 20 is uniformly pressed down the flat surface of semiconductor chip 15, underfill resin 20 which has flown out enters into opening 10 from inside edge 35 at each opening 10 [see FIG. 18C], flows inside of opening 10 as illustrated in FIG. 19A, moves out of opening 10 from outside edge 36 as illustrated in FIGS. 19B, 19C, and again moves forward onto solder resist film 9. This flow is substantially consistent with a direction in which wires 3 provided on the bottom of each opening 10 extend. In this embodiment, wires 3 extend along the width direction orthogonal to the longitudinal direction of opening 10.

On the other hand, since board core 13 is formed of a glass epoxy resin, its surface texture is rough as compared with a metal surface such as wire 3 made of copper or solder layer 12 or the like. For this reason, underfill resin 20 flows (moves) at a higher speed than the speed at which it flows on the surface of board core 13.

Figure 18A:
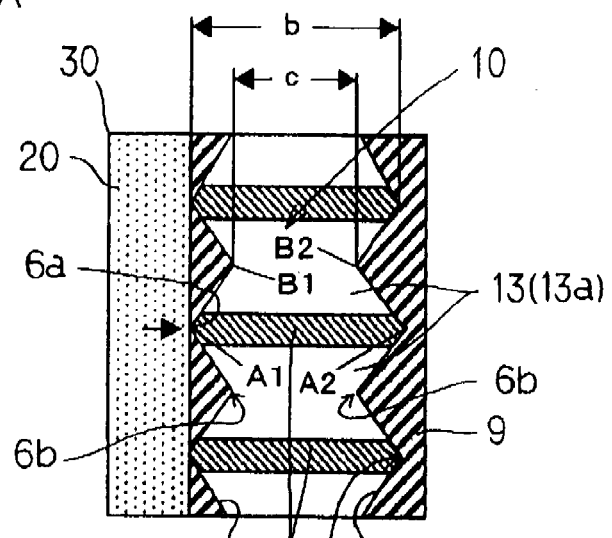
FIG. 18A, FIG. 18B, FIG. 18C are schematic diagrams illustrating a state in which the underfill resin flows into an opening and spreads over the opening.

In the embodiment, a pair of edges of opening 10 along the longitudinal direction are zig-zag edges 6 in which the widths of the opening 10 seem to be longer and shorter in a repeating sequence. Also, recessed edge portions 6a which recess toward the outside of opening 10 formed by zig-zag edges 6 in the width direction correspond to (are positioned on) wires 3. Also, protruded edge portions 6b which protrude toward the inside of opening 10 formed by zig-zag edges 6 in the width direction correspond to (are positioned on) board core 13 which is exposed between adjoining wires 3. Accordingly, as illustrated in FIG. 18A, opening width b on wire 3 is longer than opening width c on board core 13. For example, although it has no particular limitations, when the width of wire 3 is approximately 60 microns, and wires 3 are arranged at a pitch of approximately 150 microns, opening width b on wire 3 is approximately 300 microns, and opening width c on board core 13 is approximately 250 microns.

With the flip chip connection operation, underfill resin 20 moves forward toward inside edge 35 of opening, as illustrated in FIG. 18A. The heads of underfill resin 20, which move forward on the surface of solder resist film 9, actually vary in position, but it is assumed in FIG. 18A that they constantly move forward, and the head portions are represented by a straight line. At the time the head of underfill resin 20 reaches recessed edge portion 6a, the surface of solder resist film 9 is exposed between the head of underfill resin 20 and protruded edge portion 66b in a triangular shape.

Figure 18B:
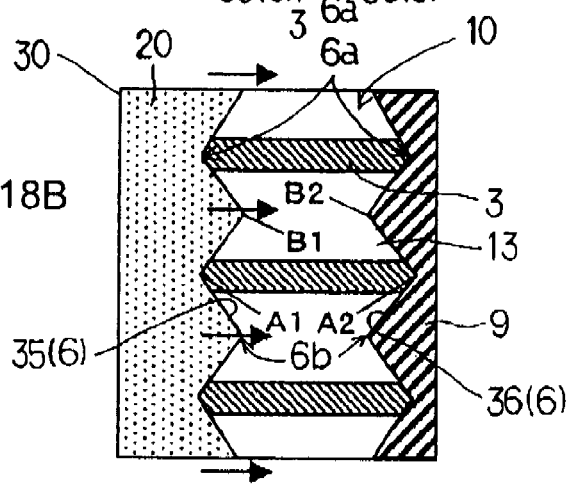

Underfill resin 20 which flows onto solder resist film 9 does not flow into opening 10 unless a predetermined amount of underfill resin 20 reaches over substantially the entirety of zig-zag edge 6 of opening 10. This is attributable to the surface tension resulting from the viscosity exhibited by underfill resin 20, and the surface state of solder resist film 9. Therefore, even if underfill resin 20 reaches recessed edge portion 6a earlier, it does not immediately flow into opening 10. Then, as illustrated in FIG. 18B, at the time underfill resin 20 spreads over substantially the entirety of zig-zag edge 6, and a predetermined amount of underfill resin 20 reaches (at the time underfill resin 20 reaches to a predetermined height), underfill resin 20 flows into opening 10. A phenomenon as illustrated in FIG. 18B takes place because a certain amount of time is taken for underfill resin 20 to reach a predetermined height.

Underfill resin 20 which has flowed into opening 10 flows (moves forward) on the surface of wire 3 which is a metal surface, and on the surface of board core 13 made of glass epoxy resin. Underfill resin 20 which has flowed into opening 10 starts to flow at different positions A1, B1 on wire 3 and board core 13 and stops flowing at different positions A2, B2 on wire 3 and board core 13 within opening 10 [see FIG. 18B]. As compared with flow start position B1 on board core 13 which discourages underfill resin 20 from flowing, flow start position A1 on wire 3 which encourages underfill resin 20 to flow is located backward with respect to the flow direction (travelling direction). Also, as compared with flow stop position B2 on board core 13 which discourages underfill resin 20 from flowing, flow end position A2 on wire 3 which encourages underfill resin 20 to flow is located forward with respect to the flow direction (travelling direction).

Figure 18C:
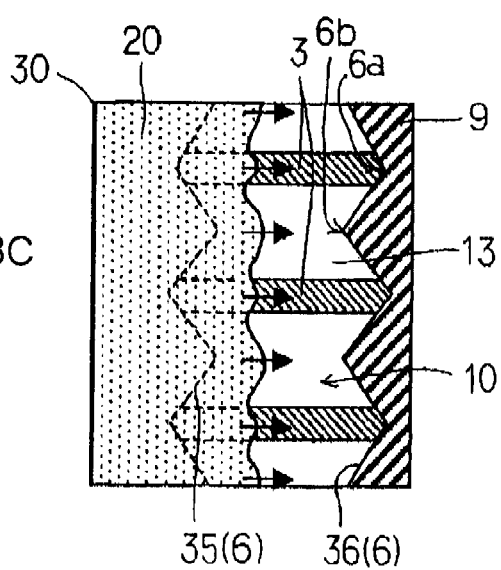
Figure 19A:
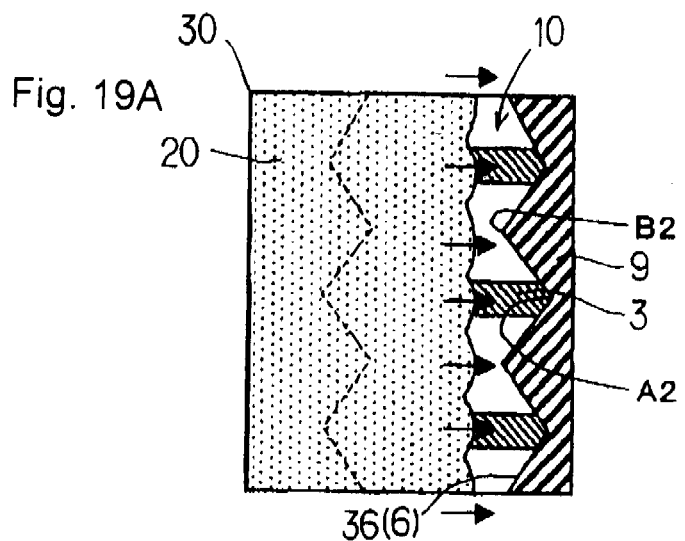
FIG. 19A, FIG. 19B, FIG. 19C are schematic diagrams illustrating a state in which the underfill resin flows through the opening and spreads from the opening onto a solder resist film.
Figure 19B:
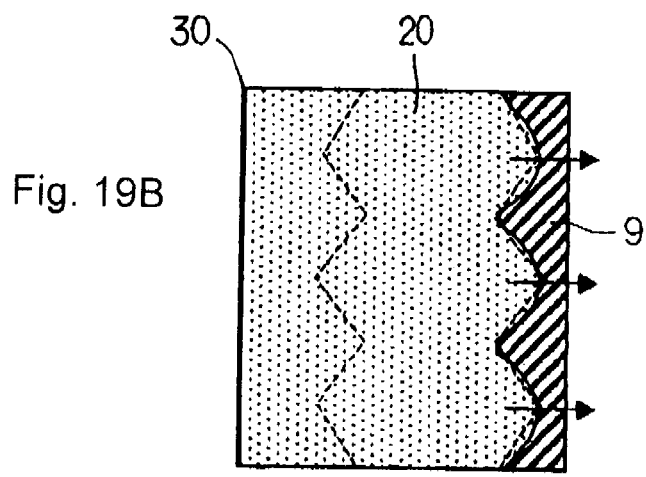
Figure 19C:
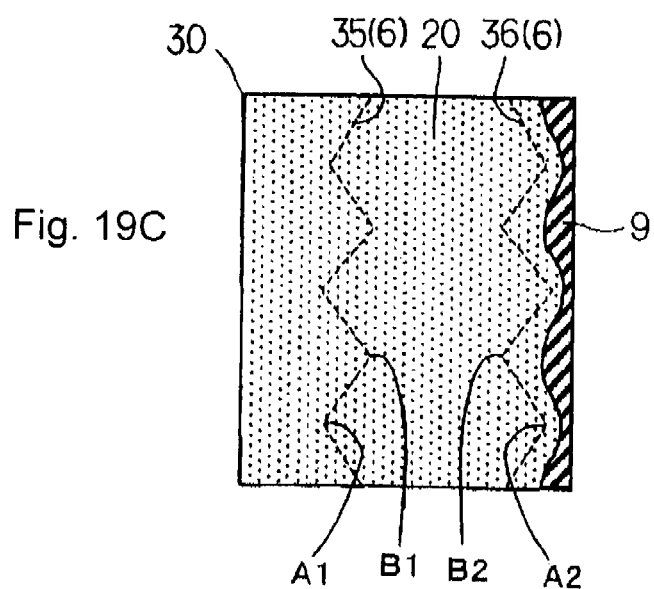

Thus, the head portions of underfill resin 20 on wires 3, which have started to flow from the rear, and which flow on board core 13, are initially delayed but travel similar positions as they come closer to a midpoint of the flow path, as illustrated in FIG. 18C, catch up at the midpoint, and are positioned forward of the heads of underfill resin 20 on board core 13, as illustrated in FIG. 19A, after they have passed the midpoint. Then, as illustrated in FIG. 19B, at flow stop positions A2, B2, the heads of both substantially simultaneously reach recessed edge portions 6a and protruded edge portions 6b, respectively. Subsequently, as illustrated in FIG. 19C, underfill resin 20 flows to again crawl up from opening 10 onto solder resist film 9, as illustrated in FIG. 19C. It should be noted that the portions of salient electrodes 17 that are connected with connection pads 11 are omitted in FIGS. 18 and 19.

Figure 5:
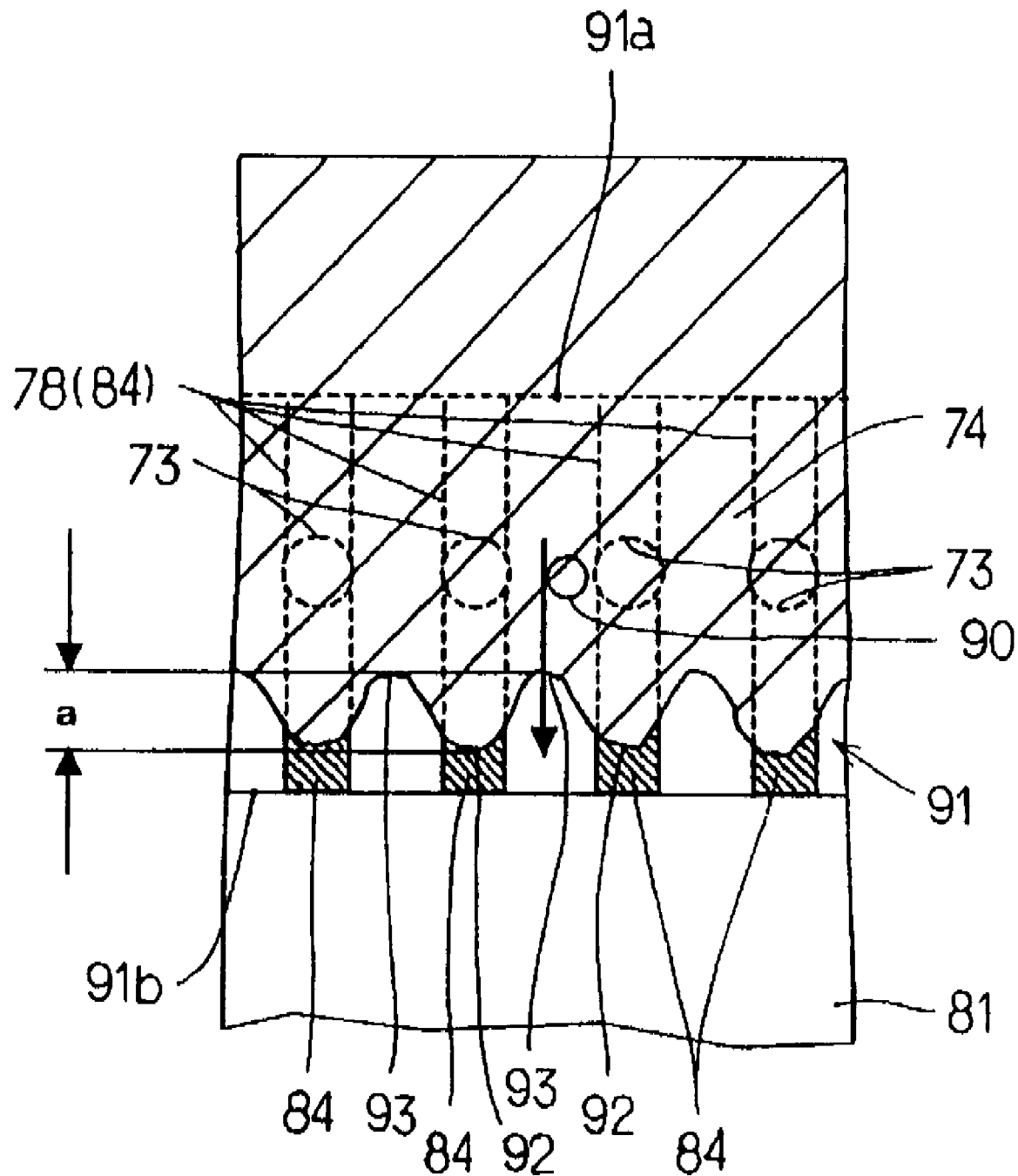
FIG. 5 is a plan view schematically illustrating the spreading state of the underfill resin when the semiconductor chip is flip chip connected to the wiring board according to the method of manufacturing the semiconductor device of FIG. 1.

There is not a large difference between the head portions of underfill resin 20 which flow on wires 3 and the head portions of underfill resin 20 which flow on board core 13. For example, assume that when the length of opening width b on wires 3 is equal to the width of opening 91 shown in FIG. 5, there is difference d between advanced head portion 92 and delayed head portion 93 at the time that underfill resin 74 flows out from inside edge 91a toward outside edge 91b and advanced head portion 92 reaches outside edge 91b. In this event, opening width b on wire 3, opening width c on board core 13, and difference d in the embodiment are selected to satisfy the following equation:

$$b-c=d \qquad \text{[Equation ]1}$$

Thus, when the zig-zag shapes of zig-zag edges 6 of inside edge 35 and outside edge 36 are made symmetric, the height of the peak of zig-zag edge 6 in the embodiment, i.e., the length (height) along the flow direction of flow start position A1 on wire 3 and flow start position B1 on board core 13, is d/2. As a result, in the embodiment, the difference between the advanced head portion and delayed head portion of underfill resin 20 is one half (d/2) at maximum, as compared with the structure of opening 91 illustrated in FIG. 5, so that air is less likely to be caught up.

Underfill resin 20 undergoes heat treatment (curing) for a predetermined time and is cured to form the underfill resin layer. As a result, air bubble (void) is less likely to occur in the underfill resin, including the underfill resin portion which covers the opening.

Next, as illustrated in FIG. 20, resin layer 21a of a predetermined height is formed of an insulating resin on first surface 30a of wiring mother board 30 to cover semiconductor chip 15, underfill resin 20, and first surface 30a (S104). Resin layer 21a is formed, for example, of an epoxy resin. Also, resin layer 21a is formed, for example, by a transfer molding apparatus.

Figure 21:
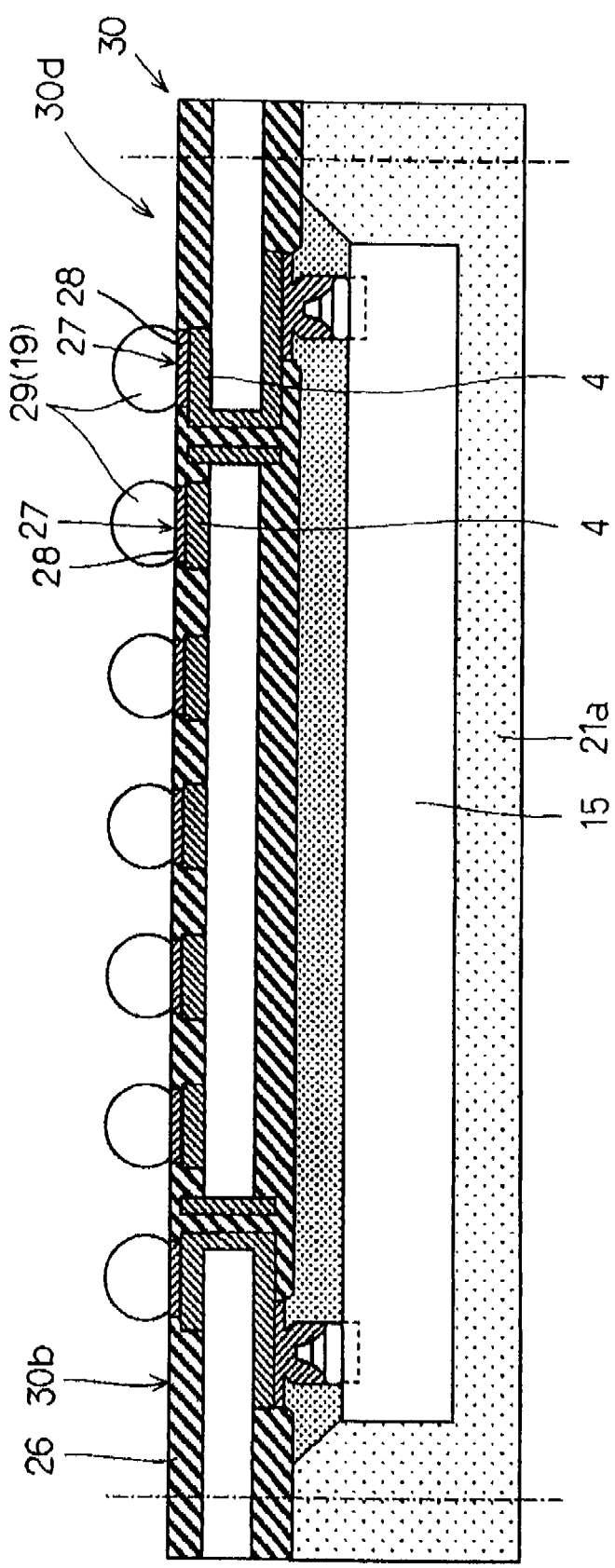
FIG. 21 is a cross-sectional view illustrating a state in which salient electrodes are formed on the second surface of the product forming area in a step of manufacturing the semiconductor device of Embodiment 1.

Next, as illustrated in FIG. 21, with second surface 30b of wiring mother board 30 oriented upward, salient electrodes 29 are fixed on wires 4 provided on second surface 30b to form external electrode terminals 19 (S105). The surface of wire 4 positioned at electrode forming hole 27 is covered with solder layer 28, and salient electrode 29 is connected onto this solder layer 28. Salient electrode 29 is formed, for example, by attaching a PbSn solder ball onto wire 4 and by reflowing.

Figure 22:
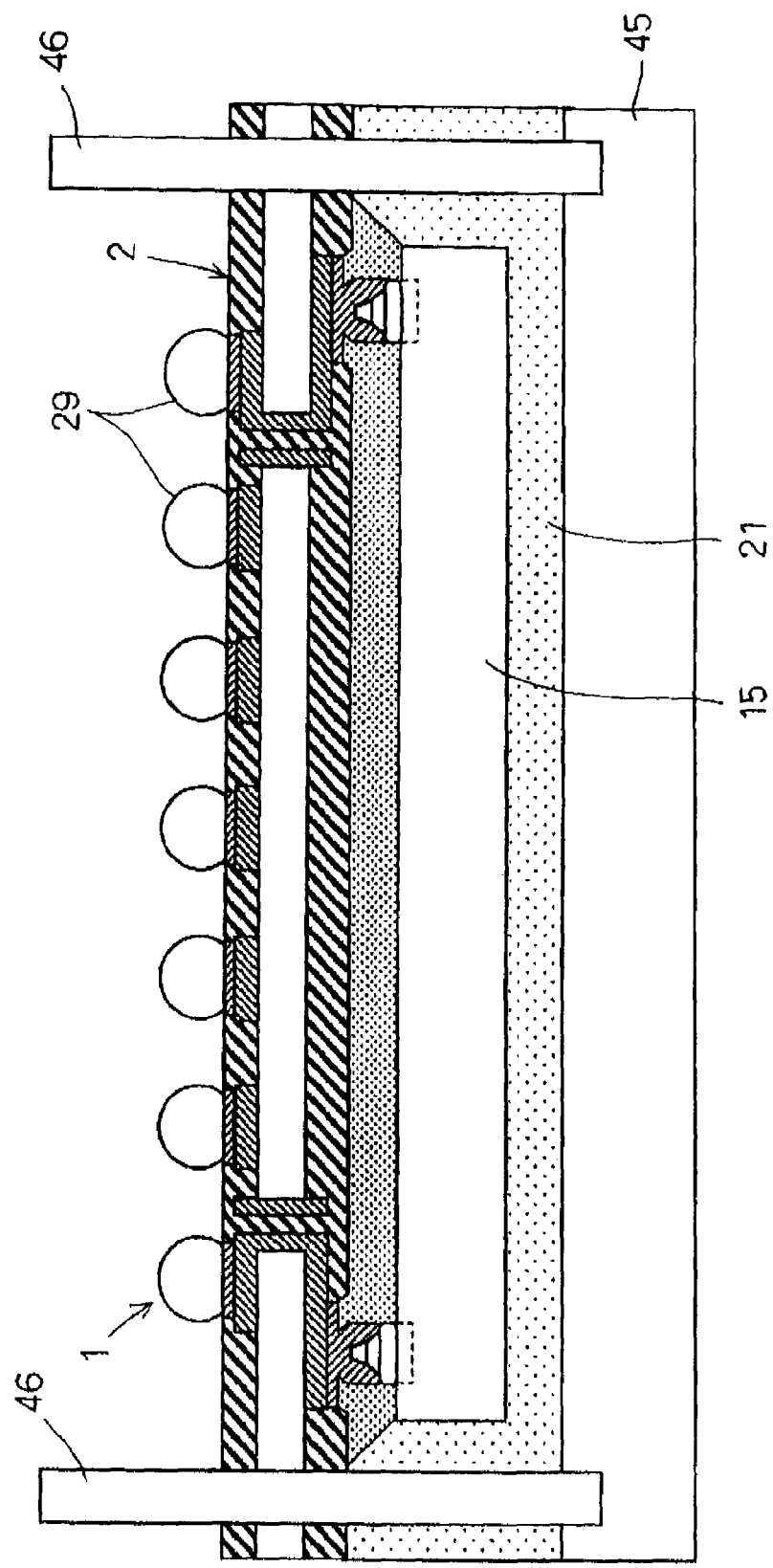
FIG. 22 is a cross-sectional view illustrating a state in which the wiring mother board and resin layer are cut for singulation in a step of manufacturing the semiconductor device of Embodiment 1.

Next, as illustrated in FIG. 22, wiring mother board 30 is vertically and horizontally cut by dicing blade 46 for singulating wiring mother board 30 (S106). The cutting by dicing blade 46 is performed along the edges of product forming area 30d to the intermediate depth of dicing tape 45. In this way, singulated semiconductor device 1 is supported by dicing tape 45. Then, after completing the dicing, a plurality of semiconductor devices 1 illustrated in FIGS. 6 and 7 can be manufactured by striping off dicing tape 45. Wiring mother board 30 is cut into wiring substrates 2 and resin layer 21a becomes into sealants 21.

Alternatively, in the present invention, the angle at which one pair of zig-zag edges 6 of opening 10 bend in a zig-zag shape be formed so that it is different from the angle of the opposing pair of zig-zag edges 6. The state of these zig-zag edges may be selected as appropriate depending on the materials of wiring board 2 and wire 3, and the material of the underfill resin that is used.

According to the technique of manufacturing the semiconductor device of Embodiment 1, the following effects are provided.

(1) The electrodes (salient electrodes 17) of semiconductor chip 15, which is flip chip connected to wiring mother board 30 (cut into wiring boards 2) are electrically connected to elongated wires 3 (connection pads 11) by an operation of squeezing underfill resin 20, that is partially coated on the surface of each product forming area of wiring mother board 30, by pressing the semiconductor chip 15 against resin 20. Wires 3 are elongated, and positioned on the bottom of opening 10 defined by an elongated groove formed through solder resist film 9 disposed on the surface of wiring mother board 30. In the flip chip connection, underfill resin 20, which is squeezed and flows, enters into opening 10 from solder resist film 9, flows inside of opening 10, moves out of opening 10, and again flows onto solder resist 9. In this event, underfill resin 20 flows along the direction in which elongated wires 3 extend in opening 10. Underfill resin 20 flows (moves) at a speed higher on the surface of wires 3 (solder layer 12) made of metal, as compared with the speed at which it flows on the surface of board core 13 which constitutes wiring mother board 30.

Recessed edge portions 6a which recess toward the outside of opening 10 formed by zig-zag edges 6 in the width direction correspond to wires 3, while protruded edge portions 6b which protrude toward the inside of opening 10 in the width direction correspond to (are positioned on) board core 13 which is exposed between adjoining wires 3, so that opening width b above wires 3 is longer than opening width c above board core 13. Also, underfill resin 20 flowing on solder resist film 9 flows into opening 10 when a predetermined amount reaches over entire zig-zag edge 6 of opening 10. As a result, the underfill resin 20 moves forward on wires 3 for a longer distance compared with the distance that underfill resin 20 moves forward on board core 13. Accordingly, because the head portions of flowing underfill resin 20 move forward without there being a large difference in the distance that the resin travels on wire 3 and board core 13, air that is associated with disturbed heads of underfill resin 20, is less likely to be caught up. Consequently, it is possible to manufacture semiconductor device 1 which obviates air bubble (void) from occurring in the underfill resin layer.

Embodiment 2

FIG. 23 illustrates a plan view of a first surface of a product forming area of a wiring mother board used in a method of manufacturing a semiconductor device according to Embodiment 2 of the present invention.

Semiconductor device 1 of Embodiment 2 is structured so that it has respective zig-zag edges 6 of inside edge 35 and outside edge 36 which are formed to undulate in wavy shape 50, as illustrated in FIG. 23, instead of the linearly bent pattern in Embodiment 1, in openings 10 formed through first surface 30a of each product forming area 30d.

In Embodiment 2, inside edge 35 and outside edge 36 of opening 10 are undulated zig-zag edges 6 as well, the length of the opening portion of overlying wire 3 is longer as compared with the length of the opening portion overlying board core 13. As a result, underfill resin 20 moves forward on wires 3 for a longer distance compared with the distance that underfill resin 20 moves forward on board core 13. Accordingly, the head portions of flowing underfill resin 20 move forward without there being a large difference in the distance that the resin travels on wire 3 and that on board core 13, and a small difference in traveling distance therebetween makes air less likely to be caught up due to disturbed heads. Consequently, it is possible to manufacture semiconductor device 1 which obviates air bubble (void) from occurring in the underfill resin layer.

While the invention made by the inventors has been specifically described based on the embodiments, it goes without saying that the present invention is not limited to the embodiments described above, but can be changed in various ways without departing from the gist thereof. While the openings are formed along each side of the square wiring board, respectively, in the embodiments, the occurrence of air bubbles (void) can be restrained in a manner similar to the embodiments even in a configuration in which the openings are provided only along two opposing sides. The configuration which has the openings along two opposing sides refers to a structure in which electrodes are arranged along both sides of square semiconductor chip 15, respectively, in semiconductor chip 15.

Although certain preferred embodiments of the present invention have been shown and described in detail, it should be understood that various changes and modifications may be made without departing from the spirit or scope of the appended claims.

What is claimed is:

1. A semiconductor device having at least:
    a square wiring board having a board core made of an insulating material, wires made of a metal and formed on a first surface of said board core, a solder resist film formed on the first surface to cover said wires, and openings formed by partially opening said solder resist film, wherein a plurality of said wires are arranged in parallel on the bottom of said openings;
    a semiconductor chip having electrodes flip chip connected to said wires arranged on the bottom of said openings of said wiring board through a conductive bonding material; and
    an insulating resin for filling an interstice between said wiring board and said semiconductor chip,
    wherein said wires extend along a width direction orthogonal to a longitudinal direction of said openings,
    said openings comprise elongated grooves which extend along at least two opposing sides of the square of said wiring board,
    a pair of opposing edges of said opening along the longitudinal direction define zig-zag edges in which the widths of the opening seem to be longer and shorter in a repeating sequence, and recessed edge portions which recess toward the outside of said opening formed by said zig-zag edges in the width direction correspond to said wires, and protruded edge portions which protrude toward the inside of said opening formed by said zig-zag edges in the width direction correspond to said board core between adjoining said wires.

2. The semiconductor device according to claim 1, wherein said zig-zag edge is a linearly bent edge.

3. The semiconductor device according to claim 1, wherein said zig-zag edge is an edge undulated into a wavy shape.

4. The semiconductor device according to claim 1, wherein said wire in said opening is formed with a plated film made of metal on a surface thereof.

5. A method of manufacturing a semiconductor device having the steps of:
   (a) providing a square wiring board having a board core made of an insulating material, wires made of a metal and formed on a first surface of said board core, a solder resist film formed on the first surface to cover said wires, and a plurality of openings formed by partially opening said solder resist film, wherein a plurality of said wires are arranged in parallel on the bottom of said opening;
   (b) coating an insulating resin in an area surrounded by said plurality of openings on the first surface of said wiring board; and
   (c) pressing a semiconductor chip against the first surface of said wiring board in a state in which electrodes face the first surface to flip chip connect said each electrode to said wire in said openings, and opening up said insulating resin with said semiconductor chip to fill an interstice between said wiring board and said semiconductor chip, wherein in said step (a), when said openings are formed through said solder resist film, said openings are formed as elongated grooves which extend along at least two opposing sides of said wiring board which is square in shape, and said wires are formed to extend in a width direction orthogonal to a longitudinal direction of said openings, a pair of opposing edges of said opening along the longitudinal direction are formed in zig-zag edges in which the widths of the opening seem to be longer and shorter in a repeating sequence, recessed edge portions which recess toward the outside of said opening formed by said zig-zag edges in the width direction are formed to correspond to said wires, and protruded edge portions which protrude toward the inside of said opening formed by said zig-zag edges in the width direction are formed to correspond to said board core between adjoining said wires.

* * * * *